(12) United States Patent
Arnold

(10) Patent No.: US 9,032,877 B2
(45) Date of Patent: May 19, 2015

(54) METHOD AND AN APPARATUS HAVING A COMPRESSIBLE COLLAR FOR THERMALLY TREATING A PHOTOSENSITIVE PRECURSOR

(71) Applicant: E I DU PONT DE NEMOURS AND COMPANY, Wilmington, DE (US)

(72) Inventor: Carl Bernard Arnold, Newark, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 13/664,986

(22) Filed: Oct. 31, 2012

(65) Prior Publication Data

US 2013/0108969 A1   May 2, 2013

Related U.S. Application Data

(60) Provisional application No. 61/554,666, filed on Nov. 2, 2011.

(51) Int. Cl.
   *G03F 7/36*   (2006.01)

(52) U.S. Cl.
   CPC ........................................ *G03F 7/36* (2013.01)

(58) Field of Classification Search
   None
   See application file for complete search history.

(56) References Cited

U.S. PATENT DOCUMENTS

| | | |
|---|---|---|
| 3,060,023 A | 10/1962 | Burg et al. |
| 3,264,103 A | 8/1966 | Cohen et al. |
| 4,323,636 A | 4/1982 | Chen |
| 4,323,637 A | 4/1982 | Chen et al. |
| 4,427,759 A | 1/1984 | Gruetzmacher et al. |
| 4,726,877 A | 2/1988 | Fryd et al. |
| 4,753,865 A | 6/1988 | Fryd et al. |
| 5,015,556 A | 5/1991 | Martens |
| 5,053,828 A | 10/1991 | Ndebi et al. |
| 5,175,072 A | 12/1992 | Martens |
| 5,215,859 A | 6/1993 | Martens |

(Continued)

FOREIGN PATENT DOCUMENTS

| | | |
|---|---|---|
| EP | 0 741 330 A1 | 11/1996 |
| EP | 1 195 655 A2 | 4/2002 |

(Continued)

OTHER PUBLICATIONS

Gent, A. N. and Thomas, A. G., The Deformation of Foamed Elastic Materials, Journal of Applied Polymer Science, vol. 1, Issue No. 1, pp. 107-153, 1959.

(Continued)

*Primary Examiner* — Joshua D Zimmerman

(57) ABSTRACT

The invention pertains to a method and apparatus for preparing a printing form from a precursor, particularly a method and apparatus for preparing the printing form by thermally treating a photosensitive precursor having a photopolymerizable layer. The method and apparatus includes heating the photosensitive precursor to a temperature sufficient to cause a portion of the layer to liquefy, contacting the precursor with a development medium to remove the liquefied material, and supporting a development medium with a core member adjacent an exterior surface of the photosensitive precursor, wherein a compressible collar of a closed-cell foam having a Poisson's ratio of less than 0.4 is disposed between the core member and the development medium.

11 Claims, 3 Drawing Sheets

(56) References Cited

U.S. PATENT DOCUMENTS

| | | |
|---|---|---|
| 5,227,853 A | 7/1993 | Proulx et al. |
| 5,262,275 A | 11/1993 | Fan |
| 5,279,697 A | 1/1994 | Peterson et al. |
| 5,506,086 A | 4/1996 | Van Zoeren |
| 5,607,814 A | 3/1997 | Fan et al. |
| 5,719,009 A | 2/1998 | Fan |
| 5,766,819 A | 6/1998 | Blanchet-Fincher |
| 5,840,463 A | 11/1998 | Blanchet-Fincher |
| 6,463,250 B1 | 10/2002 | Chen et al. |
| 6,640,866 B2 | 11/2003 | Kerr et al. |
| 6,797,454 B1 | 9/2004 | Johnson et al. |
| 6,998,218 B2 | 2/2006 | Markhart |
| 7,202,008 B2 * | 4/2007 | Roshelli et al. ............. 430/254 |
| 7,358,026 B2 | 4/2008 | Dudek et al. |
| 7,398,812 B2 | 7/2008 | Hackler et al. |
| 7,422,840 B2 | 9/2008 | Dudek et al. |
| 7,503,258 B2 | 3/2009 | McMillen et al. |
| 2005/0247222 A1 * | 11/2005 | McLean et al. ............. 101/401.1 |
| 2006/0027113 A1 | 2/2006 | Hackler et al. |
| 2006/0105268 A1 | 5/2006 | Vest |
| 2009/0235835 A1 * | 9/2009 | Hull et al. ............. 101/401.1 |
| 2009/0297715 A1 | 12/2009 | Luetke et al. |
| 2010/0062376 A1 * | 3/2010 | Armstrong et al. ........... 430/306 |

FOREIGN PATENT DOCUMENTS

| | | |
|---|---|---|
| EP | 1 195 661 A2 | 4/2002 |
| EP | 1 624 344 A2 | 2/2006 |
| EP | 2 112 556 A1 | 10/2009 |
| WO | 98/13730 A1 | 4/1998 |
| WO | 2007/012023 A2 | 1/2007 |

OTHER PUBLICATIONS

Soong, Tsai-Chen and Li, Chun, The Steady Rolling Contact of Two Elastic Layer Bonded Cylinders With a Sheet in the Nip, Int. J. Mech. Sci., vol. 23, pp. 263-273, 1981.

Bentall, R. H. and Johnson, K. L., An Elastic Strip in Plane Rolling Contact, Int. J. Mech. Sci., vol. 10, pp. 637-663, 1968.

IM1366 PCT Search Report.

* cited by examiner

METHOD AND AN APPARATUS HAVING A COMPRESSIBLE COLLAR FOR THERMALLY TREATING A PHOTOSENSITIVE PRECURSOR

CROSS-REFERENCE TO RELATED APPLICATION

This application claims priority under 35 U.S.C. §119 from U.S. Provisional Application Ser. No. 61/554,666 (filed Nov. 2, 2011), the disclosure of which is incorporated by reference herein for all purposes as if fully set forth.

BACKGROUND OF THE INVENTION

1. Field of the Disclosure

This invention pertains to a method and apparatus for preparing a printing form from a precursor, particularly a method and apparatus for preparing the printing form by thermally treating a photosensitive precursor.

2. Description of Related Art

Flexographic printing plates are well known for use in printing surfaces which range from soft and easy to deform to relatively hard, such as packaging materials, e.g., cardboard, plastic films, aluminum foils, etc. Flexographic printing plates can be prepared from photosensitive elements containing photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, photopolymerization of the photo-polymerizable layer occurs in the exposed areas, thereby curing and rendering insoluble the exposed areas of the layer. Conventionally, the element is treated with a suitable solution, e.g., solvent or aqueous-based washout, to remove the unexposed areas of the photopolymerizable layer leaving a printing relief which can be used for flexographic printing. However, developing systems that treat the element with a solution are time consuming since drying for an extended period (0.5 to 24 hours) is necessary to remove absorbed developer solution.

As an alternative to solution development, a "dry" thermal development process may be used which removes the unexposed areas without the subsequent time-consuming drying step. In a thermal development process, the photosensitive layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. No. 3,060,023 (Burg et al.); U.S. Pat. No. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). The exposed portions of the photosensitive layer remain hard, that is do not soften or melt, at the softening temperature for the unexposed portions. The absorbent material collects the softened un-irradiated material and then is separated from the photosensitive layer. The cycle of heating and contacting the photosensitive layer may need to be repeated several times in order to sufficiently remove the meltable composition from the un-irradiated areas and form a relief structure suitable for printing. After such processing, there remains a raised relief structure of irradiated, hardened composition that represents the irradiated image.

Processors for thermal development of flexographic printing elements are known. U.S. Pat. No. 5,279,697 and U.S. Pat. No. 6,797,454 each describe an automated process and apparatus for handling an irradiated printing element and accomplishing repeated heating and pressing to remove the unirradiated composition from the element with a web of absorbent material. Both apparatuses include a drum for supporting the photosensitive element during thermal development. Both apparatuses include a hot roll for supporting the web of absorbent material in contact with the photosensitive element to heat the element and remove the molten polymer with the absorbent material during thermal development. The hot roll can be metal having an outer surface coated with an elastomer layer with a Shore A hardness units between about 30 and about 90. The elastomer can be silicone rubber. Alternatively, the hot roll can be aluminum with an anodized finish, without any elastomer layer. The hot roll is heated by an electrical core heater to provide a temperature sufficient to melt a portion of the composition, but can be heated by steam, oil, hot air, and a variety of other heating sources to provide a temperature sufficient to melt the composition. Heat is transferred by conduction from the hot roll, through the absorbent web, to the photosensitive element upon contact so the temperature of the composition layer is raised sufficiently to enable the unirradiated portions of the composition layer to liquefy and be absorbed into the absorbent material. As the drum and hot roll rotate in contact together, the web is pressed against the photosensitive element to absorb the liquefied unirradiated composition and is then separated from the element. Several cycles of passing the element past the hot roll are repeated to progressively remove the unirradiated composition from the printing element. The hot roller is coated with a layer of elastomer coating that can have a Shore A hardness between about 30 and about 90. A preferred coating is silicone rubber about 3/16 inch thick.

In two embodiments of a thermal processor, commercially identified as CYREL® FAST 1000TD and CYREL® FAST TD4260 processors, the hot roller is a metal roller that is heated with an electrical core heater. The hot roller in the CYREL® FAST 1000TD originally included an exterior layer of a solid silicone rubber having a Shore A hardness of about 50, but the rubber covering was eliminated early on due to problems with durability as the rubber covering tended to delaminate and/or harden with use. In general, solid silicone elastomers are not compressible and have a Poisson's ratio generally above 0.45, and typically nearly 0.5.

A problem sometimes arises with thermal processing that it can be difficult to maintain the base support of the element below a temperature at which the base support distorts and/or shrinks while the composition layer is heated to a temperature sufficient to melt the unirradiated composition for removal in depth. Distortion and/or shrinkage of the base support can be avoided or at least reduced if the temperature the base support is maintained below its glass transition temperature, Tg, and/or below its annealing temperature that occurs during its manufacture. Despite efforts to cool the surface of the drum on which the photosensitive element resides, the drum typically includes an elastomeric outer layer which can isolate the base support from chilling or cooling by the drum. Base supports which experience temperatures at or above the glass transition temperature and/or annealing temperature of the base support for the element can result in distortion or deformation of the resulting printing form or plate. Deformations include waves of localized distortions resulting in a non-planar topography of the photosensitive element. Waves of distortions can form in different locations in each element processed.

Furthermore, the base support can be deformed during thermal development by the force of the hot roller that carries the absorbent material into contact with recessed portions in conjunction with the photosensitive element residing on some types of elastomeric layer on the drum. Oftentimes, in order to achieve improved relief uniformity the pressure at the nip between the hot roll carrying the absorbent material and drum carrying the photosensitive element can be increased to impress the absorbent material into the recessed areas. Increased nip pressure on the element increases the residence (i.e., dwell) time for the transfer of heat to the element. The resilient surface provided by some types of elastomeric layer under the photosensitive element can result in a longer nip zone as well as flexing or bending of the base support of the element as a result of the surface deflecting under the pressure exerted by a hot roller. Increased residence time that raises temperatures at or above the glass transition temperature or its annealing temperature of the base support, particularly while flexed, can also result in the distortion or deformation of the resulting printing form or plate. Deformation of the base support can lead to image dependent waves and creases in the resulting printing form or plate. The problem can be exacerbated by photosensitive elements with thick photopolymerizable layer as greater depth of relief surface is needed. The relief depth for the thick printing forms can be as much as about half of the thickness of the photopolymer layer.

Additionally because the photosensitive element is essentially a nearly incompressible layer, application of significant force by the hot roller at the nip can result in mismatch between the transport speed of photosensitive element on the drum and the absorbent material carried by the hot roll that are image dependent and sensitive to frictional changes. Image dependency is due to the increasing difference in height between the image areas that are raised portions and non-image areas that are recessed portions as thermal development of the relief surface progresses. Mismatch of transport speed creates differences in sheer forces that can lead to image dependent creasing in the support base that is adhesively attached to the photopolymerizable layer of the photosensitive element or impact dimensional control of the base support.

Relief printing forms having distortion's in the base support and/or the cured photopolymeric layer also result in poor print performance. In multicolor printing, when one or more of the relief printing forms have distortion the printed image has poor registration. Even in single color printing, distortion in the relief printing form may print an image that is not an accurate reproduction of its original, so called image infidelity, by printing straight lines as curves for example. The relief printing form having distortion's may also incompletely print the image due to intermittent contact of the inked surface of the printing form to the printed substrate.

It is thus desirable to provide a method for preparing a relief printing form from a photosensitive element and an apparatus for thermal development that reduces or limits heating of the base support of the element, and provides for maintaining the base support below a temperature at which the base support distorts and/or shrinks while the composition layer is heated to a temperature sufficient to melt the unirradiated composition for removal in depth. It is also desirable for the method and apparatus to avoid or reduce problems associated with delamination of an elastomeric covering on the hot roll, the need for significant force applied by the hot roll at the nip, and mismatch of transport speeds between the hot roll and the photosensitive element on the drum. Such that the desired method and apparatus can eliminate or reduce the tendency for deformations, distortions, and/or shrinkage of the base support of the photosensitive element, and/or for waves and/or creases in the resulting printing form.

SUMMARY

In accordance with this invention there is provided a method for preparing a relief printing form from a photosensitive element having an exterior surface and including a layer of a photopolymerizable composition capable of being partially liquefied. The method includes a) supporting a development medium with a core member adjacent to the exterior surface; b) heating the exterior surface to a temperature sufficient to cause a portion of the layer to liquefy and form liquefied material; and c) contacting the photosensitive element with the development medium to allow the liquefied material to be removed by the development medium. The method includes disposing a compressible collar of a closed-cell foam having a Poisson's ratio of less than 0.4 between the core member and the development medium.

In accordance with another aspect of this invention there is provided an apparatus for preparing a relief printing form from a photosensitive element having an exterior surface and including a layer of a photopolymerizable composition capable of being partially liquefied. The apparatus includes means for heating the exterior surface to a temperature sufficient to cause a portion of the layer to liquefy and form liquefied material; means for contacting the photosensitive element with the development medium to allow the liquefied material to be removed by the development medium, and means for supporting a development medium with a core member adjacent to the exterior surface, wherein the means for supporting includes a compressible collar of a closed-cell foam having a Poisson's ratio of less than 0.4 disposed between the core member and the development medium.

In some embodiments, the compressible collar has Poisson's ratio between 0.10 and 0.40.

In some embodiments, the compressible collar has a compression force deflection of 25 to about 85 pounds per square inch (psi) at 25% deflection.

In some embodiments, the compressible collar includes as an outermost layer a thermally-conductive solid elastomer.

BRIEF DESCRIPTION OF THE DRAWINGS

The invention can be more fully understood from the following detailed description thereof in connection with the accompanying drawing described as follows.

DESCRIPTION OF THE PREFERRED EMBODIMENTS

Figure 1:
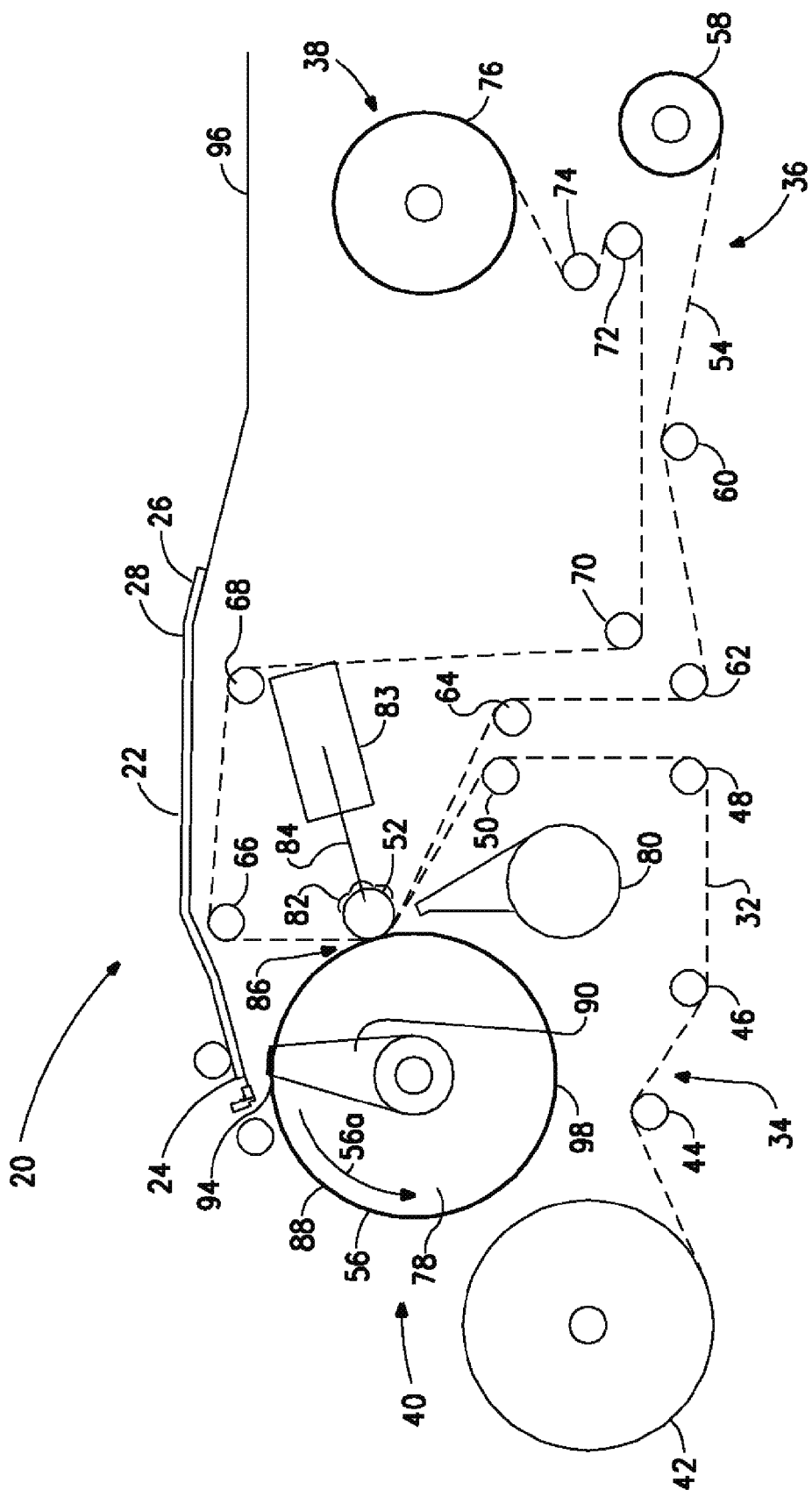
FIG. 1 is an overall schematic of one embodiment of a thermal development apparatus and process for forming a printing form from a photosensitive element.

Throughout the following detailed description, similar reference characters refer to similar elements in all figures of the drawings.

The present invention relates a method for forming a printing form from a photosensitive element, and in particular to a method for forming a relief printing form from the photosensitive element. In some embodiments the resulting printing form includes a relief pattern that is particularly suited for relief printing, including use as a flexographic printing form and letterpress printing form. Relief printing is a method of printing in which the printing form prints from an image area, where the image area of the printing form is raised and the non-image area is depressed. In some embodiments, the printing form is suited for gravure or gravure-like printing. Gravure printing is a method of printing in which the printing form prints from an image area, where the image area is depressed and consists of small recessed cups or wells to contain the ink or printing material, and the non-image area is the surface of the form. Gravure-like printing is similar to gravure printing except that a relief printing form is used wherein the image area is depressed and consists of recesses areas forming wells to carry the ink which transfer during printing. The present invention also contemplates a method and apparatus for thermally treating the photosensitive element having a layer of composition capable of being partially liquefied to a temperature sufficient to melt or soften or liquefy at least a portion of the layer for any purpose, and removing the portion of the liquefied material. In particular, the present method and apparatus thermally develops the element using a development medium supported by a core member with a compressible collar disposed between the core member and the development medium.

The presence of the compressible collar having specific properties as described herein that is interposed between a core member and the development medium during thermal treatment of a photosensitive element provides several advantages to the operation of the system as well as in the resulting printing form. The presence of the compressible collar facilitates the removal of uncured (i.e., unirradiated) material from the photosensitive element in recessed areas. The compressibility of the collar provides improved conformity to the relief surface forming in the photosensitive element, particularly during later cycles of heating and contacting when greatest relief depth in the printing form is being reached. The compressible collar disposed on a backside of the development medium (i.e., opposite a side of the development medium that contacts the photosensitive element) generally reduces the degree of force needed to be applied at the nip by the core member in order to remove uncured material (compared to prior thermal development systems). By having the compressibility of the thermal development system via the compressible collar interacting with the front side (i.e. exterior surface) of the photosensitive element, instead of an elastomer layer on the drum surface under the back side of the element, the base support of the element can be maintained flat or planar, i.e., avoids flexing or bending, throughout cycles of thermal development. This also allows for the removal of the elastomeric layer from the drum surface, so that the base support of the photosensitive element can be fully contacted by a non-insulative surface, or optionally a cooled drum surface. The base support can then be better maintained at a temperature below the temperature at which the base support distorts and/or shrinks (the glass transition temperature and/or its annealing temperature) while the composition layer is heated to a temperature sufficient to melt unirradiated composition. The presence of the compressible collar disposed between the development medium and the core member at the nip avoids or reduces image dependent mismatch of transport speeds between the development medium (and its linear transport speed) and the process nip (and the surface velocity of the rolls forming the nip, that is the drum and the core member). The present method and apparatus provides printing forms in which deformations, distortions, and/or shrinkage of the base support of the photosensitive element is reduced or eliminated and/or reduces or eliminates for waves and/or creases in the resulting printing form.

Thermal treatment (which may also be referred to as thermal development) heats the photosensitive element to a development temperature that causes unirradiated, i.e., uncured, portions of the composition layer to liquefy, i.e., melt or soften or flow, and be carried away or removed by contact with a development medium. The development medium may also be referred to herein as development material, absorbent material, absorbent web, development web, and web. Irradiated portions (i.e., cured portions) of the photosensitive layer have a higher melting or softening or liquefying temperature than the unirradiated portions (i.e., uncured portions) and therefore do not melt, soften, or flow at the thermal development temperatures. Thermal development of photosensitive elements to form flexographic printing plates is described in U.S. Pat. No. 5,015,556; U.S. Pat. No. 5,175,072; U.S. Pat. No. 5,215,859; and WO 98/13730. The photosensitive element includes a layer of photopolymerizable composition that is capable of being partially liquefied, and, in most embodiments a base support (or simply support) adjacent the photopolymerizable layer. The photosensitive element has an exterior surface on a side opposite the base support.

The method includes supporting a development medium with a core member adjacent to an exterior surface of the photosensitive element. The core member supports the development medium on its path adjacent the photosensitive element during transport of the medium in the apparatus; and, supports the development medium in contact with the exterior surface of the photosensitive element for during thermal development. The core member has a cross-sectional shape that is not limited, and can include, for example, elliptical, arcuate including convex and concave surfaces, dome, cylindrical, semi-cylindrical, wedge, and rectangular shapes. Non-cylindrically-shaped support members disclosed in U.S. Publication 2006/0027113 A1 are suitable for use as alternate embodiments of the core member. The shape of the core member can be symmetrical or asymmetrical. The core member may be solid or may include a cavity (not shown). The cavity can be used to accommodate sources of heating the support member or for circulating a heated fluid. The core member can also have the cavity to minimize its weight and for to minimize its thermal mass so as to have more rapid response to temperature changes or to minimize heat losses in undesired locations. The material/s of constructing the core member is not limited, and include, but are not limited to, steel, sheet metal, cast metal, machined metal, alloys, polymer composite materials, thermoplastic materials, thermoset materials, and combinations thereof. The material chosen for the core member should be resistant to thermal distortion at the temperatures associated with thermal processing, and able to resist displacement, i.e., bending and torsion, under the operating forces in the process.

In most embodiments of the core member has a circular cross-sectional shape, i.e., the core member has a cylindrical shape, and fully rotates or revolves about its longitudinal axis, the same as or substantially the same as a roller. In alternate embodiments, the core member may partially rotate or revolve along its longitudinal axis by moving to some extent but not so much as to complete a revolution, i.e., several degrees; or, may not rotate or revolve and remain stationary, during contacting of the development medium to the photosensitive element.

Disposed between the core member and the development medium is a compressible collar of closed-cell foam having a Poisson's ratio of less than about 0.4. In most embodiments, the compressible collar is unitary with the core member such that the combination of collar and core member acts as one to support the development medium into contact with the photosensitive element. In some embodiments, the compressible collar is removable from the core member to facilitate replacement of the compressible collar to accommodate changes in use. In some other embodiments, the compressible collar is laminated to the core member. The core member and the compressible collar together provide pressure contact of the development medium to the exterior surface of the photosensitive element at a nip between the core member with the compressible collar and the drum carrying the photosensitive element. The compressible collar can provide a covering in whole or in part of an outermost surface of the core member. The compressible collar sufficiently covers the outermost surface of the core member so that the compressible collar is disposed between the core member and the development medium throughout the range of motion, i.e., whole rotation, partial rotation, or stationary, of the core member during contacting of the development medium to the photosensitive element. In embodiments in which the core member is cylindrically-shaped and rotates, the compressible collar covers or surrounds circumferential surface of the core member. The compressible collar has an outer surface that contacts a backside of the development medium that is opposite to a front side of the development medium that contacts the exterior surface of the photosensitive element. For simplicity and unless otherwise indicated, the core member and the compressible collar on or adjacent the core member will be referred to as a roller, even though alternate shapes of the core member, less than full rotation or no rotation of the core member, and partial coverage by the compressible collar are contemplated. The roller composed of the core member and the compressible collar may also be referred to herein as a pressure roller, hot roller, nip roller. The core member and the compressible collar may also be referred to as a support member, that is, components combined to form a member that supports the development medium to the nip.

The collar is capable of being compressed, that is, capable of being reduced in volume upon application of force. Force is applied upon contact between the development medium and the photosensitive element at a nip between the drum carrying the photosensitive element and the core member supporting the development medium on or adjacent the compressible collar. The compressible collar of a closed-cell foam disposed between the core member and the development medium provides a balance of properties suitable for removal of uncured material from an elastomeric photosensitive element by thermal development. The compressible collar is capable of compressing at the nip to a degree sufficient to conform to depths and shapes of the relief structure that forms in the element to facilitate removal by the development medium of uncured material and at pressures and residence times that avoid or reduce distortion or deformation of the forming relief structure and/or wrinkles or creases in the base support. Foam provides the desired compressibility to the collar as determined by the Poisson's ratio of less than 0.4, while pores of the foam are closed-cells that provide the internal strength upon application of force as determined by the compression force deflection at 25%, without collapse of the foam. In some instances, a closed-cell foam may be referred to in the industry as a closed-cell sponge. Generally, foam is a substance that is formed by trapping pockets of gas in a solid. In closed-cell foam the gas forms discrete pockets each completely surrounded by a film of solid material, i.e., pockets are cells that are totally enclosed by its walls and do not interconnect with other cells.

Poisson's ratio is the ratio of the relative contraction strain (or transverse strain that is normal to the applied load) divided by the relative extension strain (or axial strain in the direction of the applied load). When a sample of a material is stretched in one direction, the material tends to contract (or rarely, expand) in the other two directions. Conversely, when a sample of material is compressed in one direction, the material tends to expand (or rarely, contract) in the other two directions. Poisson's ratio ($v$) is a measure of the tendency of a material to expand (or contract) in two dimensions when the material is compressed or stretched in one other dimension, respectively. In the present instance, the Poisson's ratio is a measure of the tendency of the compressible closed-cell foam to expand in two dimensions, i.e., transversely, when the foam is compressed in the other dimension, i.e., axially. The compressible collar compresses to contact the development medium into recessed portions of the photosensitive element, particularly as uncured material is removed in depth during in the later cycles of heating and contacting the element.

For the present invention, the Poisson's ratio is determined according to the following test method.

Sample Preparation

The compressible closed-cell foam is prepared for testing by cutting specimens from the foam into right, rectangular-prisms with a nominal cross-sectional area of 1.0 inch squared (1.0×1.0 inch width by length square, nominally) normal to the applied load. The thickness of the specimen is taken as the thickness of the foam. A razor knife is used to cut the specimens. Multiple specimens from the foam may be cut, tested, and the results averaged. Dimensions are measured with a caliper having resolution of 1.0 mil or better.

Test Setup

A constant rate of extension (CRE) load frame, which is provided by an Instron Model 1125, from Instron Corp. (Massachusetts, USA) with MTS TestWorks4 software, is used to compress each specimen. Precision-ground platens are used to introduce load into the foam specimen and are adjusted to ensure even contact across the specimen during testing. Alignment is +/−1.0 mil. Crosshead speed is 0.125 in/min. Although measurement for Poisson's ratio is independent of load, the load setting used for the test may be adjusted based the foam tested. For some foams a 200 pounds force (lbf) full-scale load cell is used, and for other foams a 10,000 lbf scale is used. A foam specimen is placed between two platens and the test is started. The deformity of the specimen is captured at particular axial strain % as the load on the specimen increases, which provides the transverse strain and axial strain on the specimen. Axial strain is in the direction of the applied load and transverse strain is perpendicular to the applied load.

Test Measurement

It is preferred that an optical technique is used to measure the transverse and axial strains. A camera (Canon 100 with 100 mm prime lens) is positioned to capture images of the cross-section of the specimen between the two platens as load is applied. A series of still images of the specimen are captured at 0, 10, 20, 30, 40, 50% axial strain. Afterwards, these images are imported into a software program, WinROOF, Version 5.7.2 (by Mitani Corp., Japan) to analyze the deformed shape of the specimen at each axial strain. The software has functionality to translate a location on the captured image to a spatial measurement, designated as a set of x-y co-ordinate pairs which are used to define the geometry of the specimen. At each axial strain percentage, the software generates from the captured image of the compressed foam a processed image that represents the deformed specimen and contains a set of points represented by the x-y co-ordinate pairs. The geometry of the processed image of the compressed specimen (i.e., deformed specimen) at each axial strain % is compared to the geometry of the processed image of the specimen at 0 (zero) axial %, and the deformity axially and transversely of the compressed specimen is measured and recorded as a percentage.

Calculation of Poisson's Ratio

Axial strain (percentage) and transverse strain (percentage) of the compressed specimen is plotted on an x-y scatter plot which is taken as the maximum strain values from the processed image data. A linear regression fit is drawn through the data from 0 to a maximum % axial strain that represents a linear or substantially linear relationship, that is, before the shape of the curve is non-linear, and an equation generated. In most embodiments, the linear regression fit is drawn through the data from 0 to about 30% axial strain (the data beyond about 30% axial strain is disregarded), and as such is the basis for the Poisson's ratio. In other embodiments, the linear regression fit is drawn through the data from 0 to about 20% axial strain (and the data beyond about 20% axial strain is disregarded), and as such is the basis for the Poisson's ratio. In yet other embodiments, the linear regression fit is drawn through the data from 0 to about 40% axial strain (and the data beyond about 40% axial strain is disregarded), and as such is the basis for the Poisson's ratio. The slope of the fit from the regression equation is the negative of the Poisson's ratio for the foam specimen.

The compressible collar has a Poisson's ratio between and optionally including any two of the following values: 0.40, 0.39, 0.38, 0.37, 0.36, 0.35, 0.34, 0.33, 0.32, 0.31, 0.30, 0.29, 0.28, 0.27, 0.26, 0.25, 0.24, 0.23, 0.22, 0.21, 0.20, 0.19, 0.18, 0.17, 0.16, 0.15, 0.14, 0.13, 0.12, 0.11, 0.10, 0.09, 0.08, 0.07, 0.06, and 0.05. In most embodiments, the compressible collar has a Poisson's ratio of about 0.40 to about 0.10. In some embodiments, the compressible collar has a Poisson's ratio of about 0.40 to about 0.20. In other embodiments, the compressible collar has a Poisson's ratio of about 0.35 to about 0.15. In yet other embodiments, the compressible collar has a Poisson's ratio of about 0.35 to about 0.11. In still other embodiments, the compressible collar has a Poisson's ratio of about 0.33 to about 0.15.

The compressible collar of closed-cell foam has a compression force deflection (CFD) of about 25 to about 85 pounds per square inch (psi) at 25% deflection, as determined by a test method ASTM D-1056. In some embodiments, the compression force deflection of the compressible collar is about 35 to about 70 psi at 25% deflection. In some other embodiments, the compression force deflection of the compressible collar is about 50 to about 70 psi at 25% deflection. Compression force deflection is a determination of the resistance to compression of a sample of a material when the entire surface area of the sample is compressed. In the present instance, the force to compress a standardized size sample of the closed-cell foam to a deflection of 25% is measured. The compression force deflection of 25 to 85 psi at 25% deflection provides the compressible collar with a balance of compressive force and strength such that the collar has sufficient force to move the development medium into recessed portions of the plate for removal of uncured material, yet not so much as to excessively bend or break fine raised portions, e.g., fine lines and isolated dots, in the relief structure. If the closed-cell foam has a compression force deflection at 25% deflection that is less than about 25 psi, the compressible collar may not sufficiently conform to the forming relief surface of the photosensitive element and result in poor clean-out of the relief (i.e., removal in-depth of uncured material). If the closed-cell foam has a compression force deflection at 25% deflection that is greater than about 85 psi, the compressible collar may be too stiff and result in bending of fine lines and highlight dots forming as the relief on the photosensitive element. The compressible collar has a Compression Force Deflection at 25% deflection between and optionally including any two of the following values: 25, 30, 35, 40, 45, 50, 55, 60, 65, 70, 75, 80, and 85.

The compressible collar of closed-cell foam has a density of about 15 to about 80 pounds per cubic foot (pcf). The density of the foam in some embodiments is about 25 to 70 pcf, and, in other embodiments is about 40 to 75 pcf. Density is a weight per unit volume, and can be obtained from any sample size.

Materials that can withstand continuous operation or substantially continuous operation at elevated temperatures for thermal development over time without loss of desired properties, and can form closed-cell foams are suitable for use as the compressible collar of the closed-cell foam. In some embodiments materials suitable for the compressible collar include, but are not limited to silicones, fluorosilicone rubbers, fluorocarbon rubbers, ethylene propylene diene rubbers (EPDM). In most embodiments, silicones and fluorosilicone rubbers provide the compressible collar with desired durability and resistance to heat and to chemicals. Silicones do not deteriorate or degrade at temperatures at least to about 450° F. (232.2° C.), which encompasses temperatures suitable for thermal development of photosensitive elements. In other embodiments, nitrile rubbers, chloroprene rubbers, and butyl rubbers are suitable for use as the compressible collar. Silicones and silicone foams are manufactured and/or sold by Rogers Corporation (USA), Saint-Gobain Performance Plastics Corporation (USA), Silicone Engineering (UK), Silaflex High Performance Products (USA), Reiss Manufacturing (USA), Wacker Chemical Corp (USA), Momentive (USA), and Dow Corning Corp. (USA).

Most commercially available closed-cell silicone foams have a compression force deflection that is less than about 22 psi at 25% deflection, and typically from 5 to 22 psi at 25% deflection. Most commercially available solid (i.e., non-foamed) silicones have a compression force deflection that is from 50 psi to greater than 400 psi at 25% deflection, and typically well above 100 psi at 25% deflection. Silicone closed-cell foams or sponge are typically produced by adding chemical blowing agents to pre-vulcanized silicone rubbers. During the silicone vulcanization process, the applied heat causes the blowing agent to decompose, thereby creating and trapping gas bubbles in the silicone. The trapped gas bubbles form the closed-cells within the foam. By varying the amount of blowing agent and the expansion volume ratio (i.e., volume of the cavity of a mold to the volume of the solid silicone supplied) the density of the foam (i.e., weight per unit volume) can be altered. Given the same starting silicone compound, foams that are denser have higher compression deflection forces. It is well within the skill of those in the art of manufacturing silicone foams to know how to produce closed-cell silicone foams with compression force deflection (CFD) that is higher than the CFD of commercially available closed-cell silicone foams, and in particular to produce closed-cell silicone foams with a CFD between about 25 to about 85 pounds per square inch (psi) at 25% deflection. One example of a suitable method of producing closed-cell silicone foams with higher CFDs, that is, CFD between about 25 and about 85 psi at 25% deflection, is by starting with a solid silicone compound that has an appropriately high compression force deflection and vary the amount of blowing agent and/or the expansion volume ratio to make a dense dosed-cell foam with the desired compression force deflection. The resulting closed-cell silicone foams with the higher CFDs (than currently commercially available silicone foams) would have a density that is between the density of commercially-available closed-cell foams having moderate CFDs and the density of the starting solid silicone.

At present, the Applicants are not aware of commercially-available opened-cell foams that have the desired compression force deflection given above. However, it is contemplated that if opened-cell foams were commercially available with the desired compression force deflection (and Poisson's ratio), open-celled foams would be suitable for use as the compressible collar.

The compressible collar has a thickness that is not particularly limited. In most embodiments, the compressible collar has a sufficient thickness that upon compression it can continue to facilitate removal of uncured material with the development medium from the greatest depths of recessed portions of the photopolymerizable layer. In some embodiments, the greatest depth of the recessed portions of the photopolymerizable layer is about half of the thickness of the photopolymerizable layer of the particular photosensitive element. A compressible collar that is too thin, will compress to remove some uncured material in the initial cycles, but may not be able to conform to the full depth of the recessed areas of the relief near or at the end of the cycles. In most embodiments, the thickness of the compressible collar can be 0.05 to 0.80 inch (0.13 to 2.03 cm). In some other embodiments, the thickness of the compressible collar can be 0.12 to 0.55 inch (0.31 to 1.4 cm). In yet other embodiments, the thickness of the compressible collar can be 0.15 to 0.35 inch (0.38 to 0.89 cm).

The method of preparing a roller of the compressible collar on or adjacent the core member is not limited, and is within the ordinary skill of one in the art of compounding and parts manufacture to prepare. One embodiment or preparing the roller involves compression molding which includes compounding an uncured foam composition, forming a sheet by rolling the composition, cutting the sheet to fit the core member, wrapping the sheet about the core member, blending a seam formed between ends of the wrapped sheet and filling imperfections in the foam sheet, placing core member with uncured foam roll cover into a warmed mold which then placed into an oven, baking to a suitable elevated temperature to cure the foam, removing the mold from the oven, separating the mold from the core member having the cured foam layer attached thereto, and cooling the core member with cured foam. Another embodiment or preparing a roller of the compressible collar on or adjacent the core member includes treating an outermost surface of the core member and/or applying a primer layer, or adhesive layer, or bonding material, wrapping a layer of a cured foam about the core member, and blending a seam formed between ends of the wrapped sheet and filling imperfections in the foam sheet. Optionally, an outer surface of the foam layer on the core member may be ground on a lathe to achieve the desired diameter. Alternately, the compressible collar may be clamped or otherwise mounted onto the core member.

Optionally, a layer of a thermally-conductive solid, i.e., non-foamed, elastomer can be disposed between an outermost surface of the compressible collar and the development medium. In most embodiments, the thermally-conductive solid layer is on or adjacent the outermost surface of the compressible collar. The thermally-conductive layer exterior to the core member allows the roller (i.e., core member and compressible collar) to be used as a hot roller with the capability to conduct heat through the development medium to the exterior surface of the photosensitive element. The optional layer of the thermally-conductive material can avoid the need to heat the core member to such an extent that the compressible collar could delaminate from the core member with use over time. Also since the compressible collar of foam can act as an insulator, the core member may need to be heated excessively in order to conduct sufficient heat through the compressible collar. The thermally-conductive solid layer has a thermal conductivity of about 1.0 to about 2.0 Watt per meter-Kelvin (W/m-K) in some embodiments, and about 1.3 to about 1.8 W/m-K in other embodiments.

An exterior surface of the thermally-conductive solid layer, that is the surface opposite the compressible layer, is heated by one or more radiant heaters. The one or more radiant heaters are directed at the outermost surface prior to the arrival of the development medium to the roller, and elevate the temperature of the outermost surface of the thermally-conductive layer to a temperature sufficient to conduct heat through the development medium and melt the unirradiated portion of the composition layer of the photosensitive element. The one or more radiant heaters each include one or more tubular infrared heating bulbs that are mounted in end supports connected to a frame. One or more reflectors can be present adjacent the side of the bulbs opposite the drum. The reflectors act to focus and direct the radiation toward the outermost surface of the roller.

Materials suitable for use as the thermally-conductive solid material are in some embodiments silicones, fluorosilicone rubbers, fluorocarbon rubbers, ethylene propylene diene rubbers (EPDM), and in other embodiments are nitrile rubbers, chloroprene rubbers, and butyl rubbers. Silicones and fluorosilicones do not deteriorate or degrade at temperatures at least to about 450° F. (232.2° C.), which encompasses temperatures suitable for thermal development of photosensitive elements. A composition of the thermally-conductive solid layer includes one or more fillers to provide the thermal-conductivity to the material. Fillers are compatible with the elastomeric material forming the thermally-conductive layer and include, but are not limited to, alumina (aluminum oxide), titanium dioxide, zinc oxide, iron oxide, and carbon black.

The thermally-conductive solid layer has a durometer hardness of about 40 to about 90 Shore A. In some embodiments, the thermally-conductive layer has a hardness of about 65 to about 85 Shore A durometer. The hardness of the thermally-conductive layer, as expressed by the Shore A durometer, does not negate the functionality of the underlying compressible collar. In addition to providing heat to the support member composed of the core member and compressible collar, the thermally-conductive solid layer can aid the compressible collar in contacting uncured material. In some instances, the presence of the solid thermally-conductive layer disposed above the compressible collar aids the compressible collar in introducing contact and/or maintaining sufficient contact of the development medium into small recessed (uncured) portions in the element, such as in reverse areas and around dots, to remove material. In other instances, the solid elastomeric layer disposed above the compressible collar can gently deflect the small raised portions so that small recessed portions in the element can be contacted and removed by the development medium.

The optional thermally-conductive solid elastomeric layer has a thickness such that the compressibility and other desired properties of the underlying closed-cell silicone foam layer are not impeded or substantially impeded by the optional presence of the solid layer. The thermally-conductive solid layer is relatively thin compared to the compressible closed-cell foamed layer, and in some embodiments is about a tenth of the thickness of the foamed layer. In most embodiments, the optional solid layer has a thickness of about 0.015 to about 0.045 inch (0.038 to 0.114 cm). In other embodiments, the thickness of the optional solid layer is about 0.020 to about 0.035 inch (0.051 to 0.089 cm).

Optionally, an outer surface of the compressible collar may be treated and/or has a primer layer, or adhesive layer, or bonding material to aid in the attachment of the thermally-conductive solid layer. Alternatively the thermally-conductive solid layer and the compressible collar may be clamped together or individually or otherwise mounted onto the core member.

In some embodiments, the compressible collar is integral with the core member. The compressible collar is composed of a closed-cell foam silicone or fluorosilicone, having a Poisson's ratio of 0.10 to 0.40, and a compression force deflection of 25 to 85 lb/square inch at 25% deflection.

In other embodiments, the compressible collar is integral with the core member, and the thermally-conductive solid elastomeric layer for an exterior surface that is on or adjacent the compressible collar opposite the core member. The compressible collar is composed of a closed-cell foam silicone or fluorosilicone with a thickness of 0.05 to 0.8 inch (0.13 to 2.03 cm), having a Poisson's ratio of 0.10 to 0.40, and a compression force deflection of 25 to 85 lb/square inch at 25% deflection. The thermally-conductive solid elastomeric layer is composed of a silicone or fluorosilicone with a thickness of 0.015 to 0.45 inch (0.038 to 1.14 cm) and duromneter of 40 to 90 Shore A, and a thermal conductivity of 1 to 2 Watt/meter-Kelvin. In most embodiments of the compressible collar having an exterior surface formed of a thermally-conductive solid elastomeric layer, the properties of the compressible collar, i.e., Poisson's ratio, compression force deflection at 25% deflection, and density are determined of only the material forming the compressible collar without the thermally-conductive solid elastomeric layer. In some embodiments, because the thermally-conductive solid elastomeric layer is relatively thin compared to the compressible collar and not significantly influence the results, some properties of the compressible collar, such as compression force deflection at 25% deflection, can be determined with the solid elastomeric layer present.

The method includes heating the exterior surface of the photosensitive element to a temperature sufficient to cause a portion of the layer to liquefy, i.e., unirradiated area, or an uncured or unpolymerized portion, and form liquefied material. The term "melt" is used to describe the behavior of the unirradiated portions of the composition layer subjected to an elevated temperature that softens and reduces the viscosity to permit removal by the development medium. The material of the meltable portion of the composition layer is usually a viscoelastic material which does not have a sharp transition between a solid and a liquid, so the process functions to absorb the heated composition layer at any temperature above some threshold for absorption in the absorbent material of the development medium. Thus, the unirradiated portions of the composition layer soften or liquefy when subjected to an elevated temperature. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" or "liquefy" the composition layer for the purposes of this invention. Removal by the development medium encompasses absorption by the development medium that can be considered an absorbent material. Removal may be slower at lower temperatures and faster at higher temperatures during successful operation of the process.

Means for heating the at least one photosensitive layer, i.e., photopolymerizable layer, can be by conduction, convection, radiation or other heating methods that heat the layer to a temperature sufficient to effect melting of the uncured portions but not so high as to effect distortion of the cured portions of the layer. One or more additional layers disposed above the composition layer may soften or melt or flow and be removed as well by the development medium. The photosensitive element is heated to a surface temperature above about 40° C., preferably from about 40° C. to about 230° C. (104-446° F.) in order to effect melting or flowing of the uncured portions of the composition layer.

The exterior surface of the photosensitive element can be heated by one or more sources in a thermal development apparatus. Independently or in any combination, the sources for heating are capable of heating the exterior surface of the photosensitive element to a temperature sufficient to cause a portion of the composition layer to at least partially liquefy. The method for heating each of the sources are not limited and can include, for example, an electrical core heater, electric heating blanket, steam, oil, hot air, and other heating sources that can provide a temperature sufficient to maintain or elevate the temperature of the exterior surface to melt a portion of the composition layer.

In one embodiment, heating the photosensitive element is with a radiant heater directed at the exterior surface of the element. In another embodiment, heating the photosensitive element is with a nozzle of hot air directed at the exterior surface of the element. In some embodiments, heating the photosensitive element with the radiant heater or hot air nozzle preheats the exterior surface of the element, and heating of the element is with a source for heating a support member (i.e., roller) formed of the core member and the compressible collar.

The apparatus can include a source for heating that is a focused radiant heater/s directed at the exterior surface of the photosensitive element. The radiant heater can apply all or a portion of the heat needed to the exterior surface of the composition layer, to elevate the temperature of the exterior surface of the composition layer sufficient to melt the unirradiated portion of the composition layer, causing a portion of the layer to liquefy. The heater can include one or a plurality of tubular infrared heating bulb/s mounted in end supports that also provide electrical connections to the bulb/s. The heater can also include a reflector adjacent to the bulb/s that acts to focus and direct the infrared radiation toward the exterior surface of the element.

The apparatus can include a source for heating that is a nozzle of hot air directed at the exterior surface of the photosensitive element. The hot air nozzle can apply all or a portion of the heat needed to the exterior surface of the composition layer sufficient to melt the unirradiated portion of the composition layer, causing a portion of the layer to liquefy. A thermal processor having a hot air nozzle is described in co-filed patent application, U.S. patent application Ser. No. 13/666,096.

In most embodiments as explained above, the support member or roller can include as an outermost layer a thermally-conductive layer disposed between the compressible layer and development medium. The outermost surface of the thermally-conductive layer is heated with one or more infrared heaters directed at the support member prior to arrival of the development medium to the support member. Heat is transferred by conduction from the thermally-conductive layer through the development medium to the exterior surface of the element upon contact, raising the temperature of the element and causing the uncured portions of the composition layer of the element to melt, soften, or flow into the development medium.

Although the support member can include a heat source to heat the exterior surface of the composition layer while supplying the development medium to the element, this method of heating the support member is not particularly suitable for the present invention. The transfer of heat by conduction from the core member and through the compressible layer, to the development medium to the exterior surface of the element upon contact is not effective to raise the temperature of the element and causing the uncured portions of the composition layer of the element to melt, soften, or flow into the development medium. The temperature to maintain the core member that conducts sufficient heat through the compressible layer to heat the photosensitive element typically causes problems with durability and/or delamination of the materials on the core member.

In yet other embodiments, a heating source can be associated with the drum that supports the photosensitive element during thermal development. The drum may be equipped with a heater, such as a blanket heater, which is provided to keep the photosensitive element at a stable starting temperature independent of the surrounding environment. The drum may include means for controlling a temperature of the drum, which helps to manage the thermal conditions experienced by the photosensitive element. In particular the means for controlling the temperature can be used to maintain the temperature of the support side of the photosensitive element. The means for controlling the drum temperature can include means for heating, means for cooling, and a combination thereof. Any means of heating the drum is acceptable, as long as the power capacity of the heater is sufficient to maintain a fairly constant selected skin temperature on the outer surface of the drum. If the normal operating environment is carefully controlled to be at a constant temperature, the heater can be turned off or omitted from the apparatus. As is disclosed in U.S. Pat. No. 6,797,454 B1, it is also possible that the drum can be cooled by cooling means, such as, a blower directing a stream of air at the surface of the photosensitive element and the drum and/or by the circulating of cooling fluid beneath the surface of the drum to cool the element. It is also contemplated that a fluid, such as water, may be circulated beneath the surface of the base member.

The method includes contacting the photosensitive element with the development medium to allow at least a portion of the liquefied material on the composition layer to be removed by the development medium. The core member with the compressible collar acting as a support member supports the development medium adjacent the exterior surface of the photosensitive element, so that the development medium can contact and blot or remove unpolymerized or uncured material from the element. Upon contacting of the development medium with the photosensitive element, the compressible collar compresses and readily conforms to the relief surface moving the development medium into intimate contact as the thermal development progresses to remove the uncured material in depth. The compression by the support member can avoid or minimize bending or flexing of the photosensitive element and/or the base support to remove uncured material.

By maintaining intimate contact of the development medium with the composition layer that is molten in the uncured regions, a transfer of the uncured photosensitive material from the photopolymerizable layer, i.e., partially liquefied portions, to the development medium takes place. Intimate contact of the development medium to the photopolymerizable layer may be maintained by the pressing the layer and the development medium together. The thermal development or thermal treating, which includes the steps of heating the photosensitive element and contacting the development medium to an exterior surface of the element, can be done at the same time, or in sequence provided that the uncured portions of the photopolymerizable layer are still soft or in a melt state when contacted with the development medium.

Removal or transfer of the liquefied portion from the photosensitive element to the development medium is sometimes also referred to as absorption. However, the use of the term absorption in defining the relative physical property between the development medium and the melted uncured polymeric composition is not intended to be limited to particular absorptive phenomena. There need not be penetration of the melted composition into the body of fibers, filaments or particles used for the absorbent material. The absorption into the bulk of the development material may be only by surface wetting of the interior bulk. The driving force for the movement of the melted elastomeric composition into the absorptive areas of the development medium may be one or more of surface tension, electrical forces, polarity attraction or other physical forces known to assist in promoting philicity (that is, an affinity for), adsorption, or absorption of materials. The driving force may also include pressure driven flow into a porous media.

The photosensitive element and the development medium are brought into contact with each other by relative motion between the support member (i.e., core member and compressible collar) and the drum. U.S. Pat. No. 5,279,697 and U.S. Pat. No. 6,797,454 each describe relative motion between a drum and a hot roller (i.e., support member). It is well within the ordinary skill of those in the art to provide relative motion between the base member and the support member in thermal development apparatuses in order to contact the element with the development medium. Relative motion between the base member and the support member is a means for contacting the element to the development medium. Moving the support member and/or the drum towards each other, forms the nip between the photosensitive element (supported by the drum) and the support member with the development medium between the element and the support member. The nip is the location where the support member is in an engaged position against the drum.

The support member carrying the development medium is engaged against the photosensitive element at least in contact and, in some embodiments, in pressure contact. In some embodiments, a uniform or substantially uniform pressure is applied at the nip across the width of the element during processing. This uniform pressure assumes that the image across the nip is uniform; those skilled in the art will recognize that the pressure applied will vary locally as image elements pass through the nip. Pressure is applied to force the development medium into intimate contact with the photosensitive element. In general for the present invention, the pressure applied at the nip between the support member and the drum is less than that used in commercially-available thermal processors. The pressure at the nip is dependent upon several factors including, but not limited to; the radius of the support member; the radius of the drum; the characteristics of the compressible collar of the support member, such as the thickness and compression force deflection of the closed-cell foam; and the load applied. In one embodiment, the load to apply pressure to force the development medium into intimate contact with the photosensitive element is about 20 to about 160 pounds force per linear inch (pli). In other embodiments, the load to apply suitable nip pressure is about 350 to about 100 pli.

A cycle (or pass) of the photosensitive element is essentially one rotation of the drum in the thermal processor constituting heating the element, contacting the element with the development medium to remove uncured portions, and separating the development medium from the element.

The development medium is selected to have a melt temperature exceeding the melt or softening or liquefying temperature of the unirradiated or uncured portions of the radiation curable composition and having good tear resistance at the same operating temperatures. The selected material or materials withstand temperatures required to process the photosensitive element during heating. The development medium can be in web or sheet form. In some embodiments, the development medium is composed of an absorbent material. The absorbent material of the development medium should possess a high absorbency (i.e., polymer removal efficiency) for the molten elastomeric composition as measured by milligrams of elastomeric composition that can be absorbed per square centimeter of the development medium. In other embodiments, the development medium is composed of a combination of at least two materials, one of which is a non-woven material and the other is a support film, that can provide improved mechanical properties to withstand the rigors of thermal processing and/or to prevent or minimize migration of the melt from the absorbent material to underlying support member. Materials suitable as the development medium are not limited and can be selected from absorbent materials such as non-woven materials, paper stocks, fibrous woven material, open-celled foam materials, porous materials that contain more or less a substantial fraction of their included volume as void volume. Materials suitable as the support film for the development medium are not limited and can be selected from polymeric films, paper, metals, fabrics, nonwovens, and combinations thereof. Examples of suitable combinations include metalized polymeric films, and fabrics with nonwovens. The support can be almost any polymeric material that forms films that are non-reactive and remain stable throughout the processing conditions. Examples of suitable film supports include cellulosic films and thermoplastic materials such as polyolefins, polycarbonates, and polyester. Preferred are films of polyethylene terephthalate and polyethylene naphthalate. There can be some overlap of materials suitable as the absorbent material and as the support, such as papers, fabrics, and nonwovens, due to the plethora of materials available that may have the characteristics suitable to function as the absorbent material and as the support.

Apparatus

FIG. 1 shows one embodiment of a thermal development system 20 in which the system is an apparatus for thermally processing a photosensitive element that is suitable for use as a relief printing form. The thermal development system 20 is used in conjunction with other machines to create a finished printing plate. Prior to processing in thermal development system 20, an element 22 is first exposed to actinic radiation which cures and renders insoluble the exposed portions of the element 22 through polymerization of the photopolymerizable layer. Element 22 comprises lead portion 24, tail portion 26, and exterior surface 28. After imagewise exposure, uncured portion (i.e., unexposed portion) of the photosensitive element is removed by thermal treatment to form a surface suitable for printing. The apparatus as shown in FIG. 1 is one embodiment suitable for thermal treatment of the exposed photosensitive element.

The thermal development system 20 removes unexposed polymer from a photosensitive element 22 by heating the element 22, thereby liquefying the unexposed portion of the element 22. A development medium 32, such as a non-woven web, is then put in contact with element 22 to absorb the molten polymer that comprises the unexposed portion of the element 22. The web 32 then winds away from the element 22 (described in greater detail below), thereby removing the unexposed material from the element. Once the unexposed portion is removed from the element 22, the element 22 is removed from the thermal development system 20 and ready for use as a printing form.

In the embodiment shown, the thermal development system 20 includes a web subsystem 34, a foil subsystem 36, a waste subsystem 38, and a printing form subsystem 40. Each of the subsystems is described in further detail below.

The web subsystem 34 continuously supplies a web 32 of development medium through the thermal development system 20. It will be appreciated that web 32 may be composed of any material capable of transferring unexposed portions of the photopolymerizable layer away from the photosensitive element. The purpose of the web is to contact element 22 and remove the molten unexposed portion of the photosensitive element during thermal processing. The web subsystem 36 preferably includes a supply roll 42 and rollers 44, 46, 48, and 50. The absorbent web 32 is unwound from the supply roll 42 and passes between rolls 44, 46, 48, and 50 in a serpentine path. As is described further below, the web 32 is then guided over a roller 52, that is composed of the core member 51 and the compressible collar 53, where it is mated with a foil 54 that is supplied from the foil subsystem 36 and is contacted with the element 22 which wrapped on the drum 56 of the printing form subsystem 40.

In the embodiment shown, the foil subsystem 36 supplies a foil to mate with the element 22. One purpose of the foil 54 is to protect portions of the thermal development system 20 from the molten unpolymerized portion of the element 22. While web 32 absorbs much of the molten portion of the element 22, it is possible that the molten material could, without the presence of the foil 54 penetrate the web 32, creating deposits on the pressure roller 52 and other rolls within waste subsystem 38. The foil 54 prevents the creation of these deposits and further prohibits the condensation of volatiles on parts of the thermal development system 20. Although the foil 54 can be any suitable material, the foil is most preferably a polyethylene terephthalate (PET) film. In the embodiment shown, the foil subsystem 36 includes a supply roll 48 and rollers 60, 62, and 64. The foil 54 is unwound from the supply roll 58 and passes between rolls 60, 62, and 64 in a serpentine path. The foil 54 is then guided over the roller 52 where it is mated with absorbent web 32 such that the foil 54 is pressed against the web 32, which is pressed against the element 22.

The waste subsystem 38 is for collecting the used web 32 and foil 54. The waste subsystem 38 preferably includes rollers 66, 68, 70, 72, 74, and 76. Rollers 66, 68, 70, 72, 74, and 76 are take-up rollers that provide a serpentine path for the web and the foil after they have been pressed against each other in the printing form subsystem. Roller 66 may be a load cell roll that measures tension in the development medium from nip to the roller 66. Roller 76 is a waste take-up roller around which the web 32 and the foil 54 are collected.

One or more of the rolls 44, 46, 48, 50, 66, 68, 70, 72, 74 as well as take-up roll 76 may drive the web 32. One or more of the rolls 60, 62, 64, 66, 68, 70, 72, 74 as well as take-up roll 76 may drive the foil 54. One or more of the rolls 44, 46, 48, 50, 60, 62, 64, 66, 68, 70, 72, 74 or even the supply rolls 42 and 58 may include a braking mechanism to maintain tension of the web 32 and foil 54 in its transport path. The brake may be an electronic brake of the type known in the art. Further, the number of rollers and the path of the web and the foil are shown by way of example, and any number of rollers and paths can be used.

Figure 2:
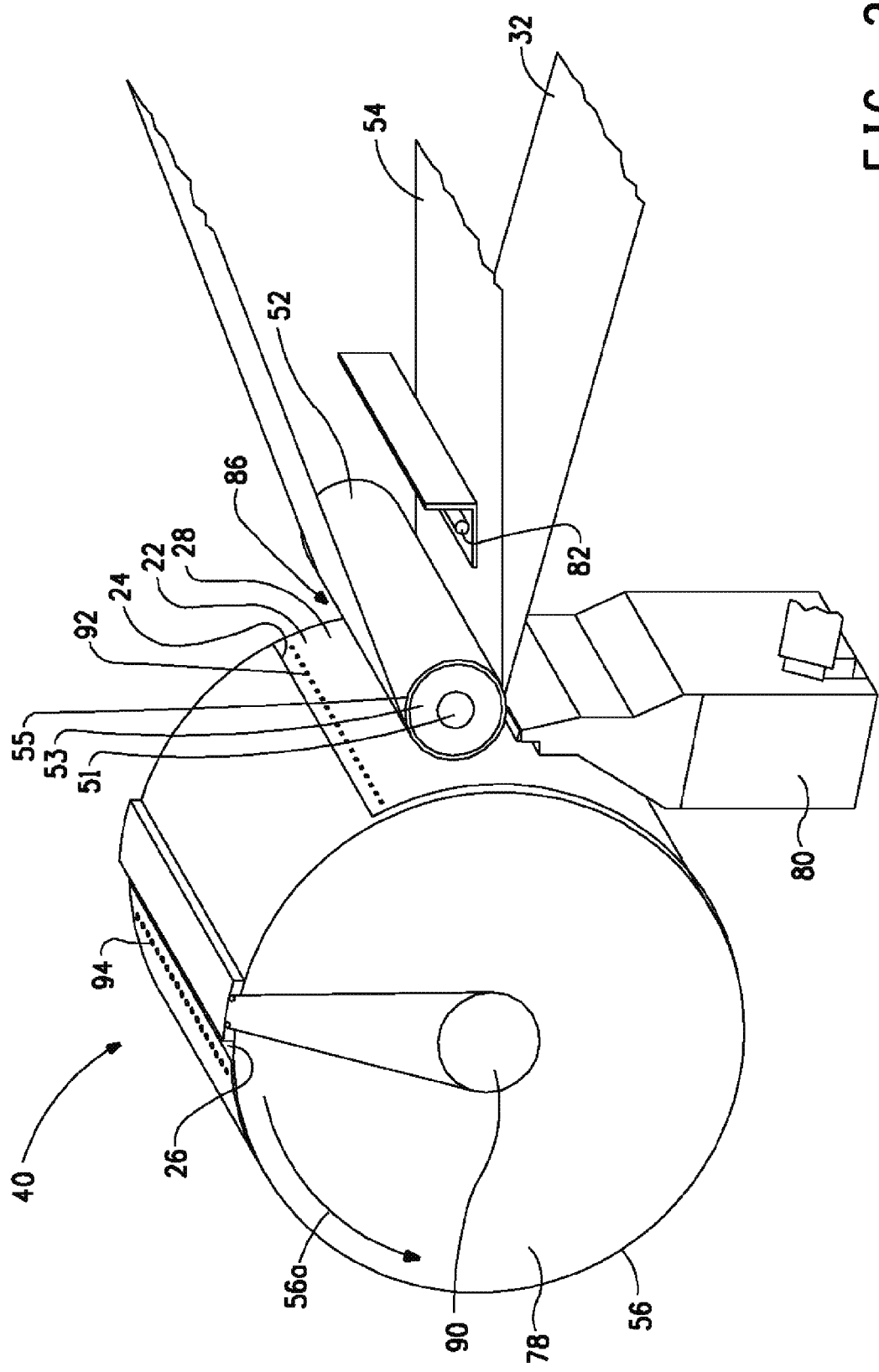
FIG. 2 is a perspective view of one embodiment of the printing form subsystem of the apparatus shown in FIG. 1.
Figure 3:
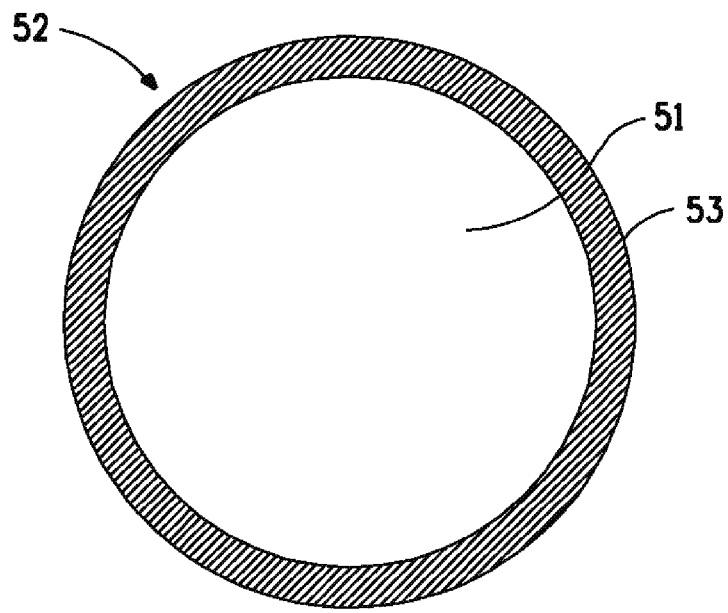
FIG. 3 is a cross-sectional view of one embodiment of a support member of the printing form subsystem, wherein support member is a roller that includes a core member having a compressible collar.
Figure 4:
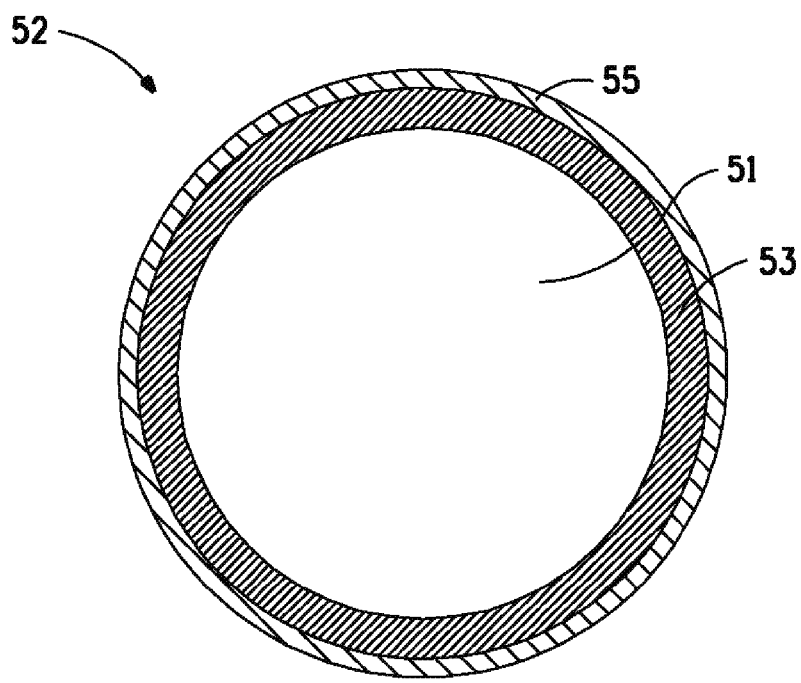
FIG. 4 is a cross-sectional view of a second embodiment of a support member of the printing form subsystem, wherein the support member is a roller that includes a core member having a compressible collar and a thermally-conductive layer thereon.

As shown in FIG. 1 and FIG. 2, one embodiment of the printing form subsystem 40 includes drum 56, cooling system 78, external heater 80, infrared heaters 82, arms 84, and nip 86. The printing form subsystem 40 also includes a support member 52, which is a means for supporting the development medium to the exterior surface. In most embodiments, the support member 52 is shaped as a roller. As shown in FIG. 3, one embodiment of the support member 52, or roller 52, is composed of the core member 51 and the compressible collar 53. An alternate embodiment of the support member 52, or roller 52, composed of the core member 51, the compressible collar 53, and thermally-conductive layer 55 is shown in FIG. 4. The support member 52, or roller 52, may also be referred to as a pressure roll 52, or nip roll 52, or hot roll 52, as in certain embodiments the support member functions in that capacity. For simplicity, the embodiment of the support member as roller 52 will be used for the description of the printing form subsystem for the apparatus. Drum 56 is the attachment point for element 22 during the thermal development process. Drum 56 is used to rotate the element 22 against the web 32 so that the unexposed molten polymer may be removed. Drum 56 has a generally cylindrical shape and includes an exterior surface 88. Drum 56 is mounted for rotation on a stationary support frame (not shown). In this embodiment, the drum 56 rotates in a counterclockwise direction as indicated by arrow 56*a*. It will be apparent to those skilled in the art that the thermal development system 20 can be configured so that the drum 56 rotates in the clockwise direction. The drum 56 is non-flexible or substantially non-flexible such that the drum 56 does not significantly change shape during the thermal development process. The drum 56 has an exterior surface 88 which can be formed by mounting a removable surface member 98 to the drum, or the surface member 98 can be integral with the drum. In most embodiments, the exterior surface 88 of the drum 56 is a metal surface that is treated, e.g., anodized or painted, to prevent or minimize corrosion of the surface and drum.

In most embodiments, the drum does not include an elastomeric layer or a resilient layer or a compressible layer or a cushion layer or a tackification layer forming an outermost surface layer on the drum. In these embodiments, the photosensitive element resides directly on the exterior surface of the drum, which is typically composed of metal, providing enhanced intimate contact of the photosensitive element on the drum. An elastomeric layer or a resilient layer or a compressible layer or a cushion layer or a tackification layer forming a surface layer on the drum insulates the photosensitive element from the cooling (or heating) effect that may be incorporated into the drum. Intimate contact of the photosensitive element to the drum, without the insulative effect of an interposed elastomeric layer (or a resilient layer or a compressible layer or a cushion layer or a tackification layer) on the drum surface, improves the thermal conductivity between the drum and the photosensitive element to facilitate maintaining the temperature of the base support of the photosensitive element below its glass transition temperature and/or its annealing temperature so that it does not distort or shrink. The exterior surface of the drum that does not include or is not formed of an elastomeric layer or resilient layer or compressible layer or cushion layer or tackification layer, but can optionally include a corrosion resistant covering, is considered an inflexible exterior surface, and can also be considered a non-insulative exterior surface or a incompressible exterior surface. The inflexible exterior surface of the drum is sufficiently rigid that it also contributes with the compressible collar to avoid or minimize bending or flexing of the photosensitive element and/or the base support during removal of uncured material; and, facilitates the compression by the compressible collar to conform to the relief surface of the element and move the supplied development medium into intimate contact as thermal development progresses to remove uncured material in depth. This embodiment can be further aided in maintaining the base support below a temperature at which it can distort or shrink, by cooling the drum.

In one embodiment, drum 56 further includes a cooling system 78. Cooling system 78 is preferably a water cooling system wherein cold water circulates within the drum so as to maintain the temperature of the backside or support of the element 22 while it is touching the drum 56. In one embodiment, the support of the photosensitive element is maintained at a temperature less than the glass transition temperature of the support for the element, i.e., at less than about 150° F. (65.6° C.). In another embodiment, the support of the photosensitive element is maintained at a temperature less than the annealing temperature of the support for the element, at less than about 130° F. (54.4° C.). In some embodiments the water cooling system cools an interior of the drum to a temperature from about 40° F. to about 110° F. (about 4 to 43.3° C.), and in some other embodiments to a temperature between about 50° F. and 75° F. (about 10 to 23.9° C.), which is capable of cooling and maintaining the temperature of the exterior surface 88 of the drum during processing. Intimate contact or substantially intimate contact of the support of the photosensitive element 22 with the cooled non-insulative surface 88 of the drum maintains the support of the element at less than its glass transition temperature and/or its annealing temperature. Cooling the drum assists in ensuring that support does not distort or shrink and the element 22 retains its shape. As is disclosed in U.S. Pat. No. 6,797,454 B1, it is also possible that the drum be cooled by an alternative cooling means, such as a blower (not shown) directing a stream of air at the surface of the photosensitive element 22 and the drum 56.

Alternatively, the drum 56 may also be equipped with a drum heater (not shown). The drum heater (not shown) may be used to keep the photosensitive element 22 at a stable starting temperature independent of the surrounding environment during thermal development so that the undeveloped portion of the printing form is at a molten state and can be absorbed by web 32. The drum heater (not shown) may be an electrical heating blanket, such as a wire wound blanket. However, any means of heating the drum 56 is acceptable, as long as the power capacity of the heater is sufficient to maintain a fairly constant selected skin temperature on the exterior surface 88 of the drum 56. It is also contemplated that a heating fluid, such as water, may be circulated beneath the surface of the drum 56.

In the embodiment shown, the temperature of the exterior surface 88 of the drum is about 50 to 150° F. (10 to 65.6° C.), preferably 75 to 95° F. (23.9 to 35° C.). These parameters are illustrative and the parameters can be adjusted to fit the specific application. If the normal operating environment is carefully controlled to be at a relatively constant temperature, the heater can be turned off or omitted from the apparatus.

In one embodiment, printing form subsystem 40 further comprises external heater 80. External heater 80 is located adjacent the drum 56 and, in the embodiment illustrated, is a slot jet forced air heater with a blower directed at an exterior surface 28 of the element 22. The external heater 80 elevates the temperature of the surface 28 of the element 22 to a temperature sufficient to melt or soften the unexposed portion of the element 22, causing a portion of the layer to liquefy so that it can be removed by web 32. The external heater 80 functions by blowing heated air on to the exterior surface 28 of the element 22. In the embodiment illustrated, the external heater 80 is pneumatically positioned to heat the element 22.

In an alternate embodiment (not shown), external heater 80 may include a plurality of tubular infrared heating bulbs that heat the exterior surface 28 of the element 22. The infrared heating bulbs can be mounted in end supports that provide electrical connections to the bulbs. This alternate embodiment further comprises a reflector located adjacent one side of the bulbs that acts to focus and direct the infrared radiation toward the exterior surface 28 of the photosensitive element 22. In another alternate embodiment (not shown) the external heater 80 uses one tubular infrared heating bulb mounted in the end supports with the reflector.

Printing form subsystem 40 further includes arms 84 which provide a means for relative motion between the drum 56 and the roller 52. Arms 84 function so that the photosensitive element 22 and the web 32 of development medium can be brought into contact with the other, and are a means for contacting the element with the development medium. Means for providing relative movement can be accomplished, for example, by mounting the roller 52 (and/or drum 56) onto arms 84 attached to a two-position pneumatic roll loading cylinder/s 83 that moves the roller 52. In alternative embodiments, relative movement of the roller 52 may be actuated by stepping motors or servo motors. Temperature sensors may also be mounted throughout the thermal development system 20 to monitor the temperature for the purpose of controlling the heating elements in the drum 56, roller 52, and heater 80.

The nip 86, or distance between the roller 52 and the drum 56, when the pressure roller 52 is in the engaged position for this embodiment, is preferably zero centimeters. It is desirable to set the distance such that a substantially uniform pressure is applied to the nip 86 of the exterior surface 28 of the form 22 during processing. Pressure is applied to force the absorbent web into intimate contact with the photosensitive element 22. It will be appreciated that the nip 86 can be adjusted to a different parameter to suit any particular application. In one embodiment, the load used to apply pressure for intimate contact between the development medium and the photosensitive element is about 20 to about 150 pounds force per linear inch (phi). In other embodiments, the load used to apply pressure is about 35 to about 100 pli.

Means for heating the exterior surface 28 of the photosensitive element 22 can be by one or more sources in the thermal development apparatus, which includes heating with the roller 52 and directed heating of the exterior surface of the element. Independently or in any combination, the sources for heating are capable of heating the exterior surface of the photosensitive element to a temperature sufficient to cause a portion of the composition layer to at least partially liquefy. The sources of heating can provide a temperature sufficient to maintain or elevate the temperature of the exterior surface to melt a portion of the composition layer. The external heater 80 acting as a first heating means and the roller 52 acting as a second heating means, independently or in any combination, are capable of heating the exterior surface 28 of the photosensitive element 22 to a temperature sufficient to cause a portion, i.e., an unexposed portion, of the composition layer to liquefy. Additional and alternate methods of heating the element 22 are possible and inclusion into the present system and method is within the skill of those in the art. Cooling system 78 functions to cool the backside surface, e.g., support, of the element 22 to ensure that the printing form retains its shape during thermal processing.

Printing form subsystem 40 includes the roller 52 to supply the development medium 32 to the photosensitive element 22, and the roller 52 can provide another means for heating the element 22. The roller 52, or hot roller 52, maintains or further elevates the temperature of the exterior surface 28 of the element 22, thereby ensuring that the undeveloped portion of the printing form is in a liquid state when in contact with web 32. Roller 52 can be heated by radiant heaters 82, such as infrared heater/s, or by other heating means, such as a cartridge heater. In one embodiment, an exterior surface of the roller 52 includes the thermally-conductive layer 55 which is heated by radiant heaters 82 (three radiant heaters 82 are shown in FIG. 1, and for simplicity, only one radiant heater 82 is shown in FIG. 2). The roller 52 is positioned adjacent the drum 56 which carries the element 22. The roller 52 is also adjacent the external heater 80.

Roller 52 also acts as the means by which web 32 and foil 54 contact the exterior surface 28 of the element 22. After web 32 and foil 54 pass through web subsystem 34 and foil subsystem 36, respectively, web 32 and foil 54 join by passing around roller 52 along a serpentine path. As web 32 and foil 54 pass roller 52, web 32 is pressed against the exterior surface 28 of element 22, thereby absorbing the molten unexposed portion of the element 22.

Process of Use

The operation of the apparatus for the process of thermally developing the photosensitive element 22 is described in reference to FIG. 1 and FIG. 2. The thermal development system 20 is in a home position with the drum 56 stationary and adjacent the feed tray 96. A support member 98 was previously mounted onto the drum 56. Alternatively, the drum 56 is constructed with a support member 98 that is integral to the drum 56. The support member 98 includes an exterior surface 88. The operator places the photosensitive element 22 on feed tray 96. An operator then engages the lead portion 24 of the element 22 to a pin bar 92 on drum 56. The heater 80 and/or the optional drum heater (not shown) may be used to preheat the drum 56. Cooling system 78 may also be used to cool the drum 56. As shown in FIG. 4, the roller 52 is composed of the core member 51 surrounded by the compressible collar 53, and a thermally-conductive layer 55 surrounding the compressible collar 53. One or more Infrared heaters 82 adjacent the roller 52 are used to preheat the roller, specifically heat the thermally-conductive layer 55 of the roller. The drum 56 starts turning and carries the photosensitive element 22 with it so that the element is adjacent the support member 98 until the tail portion 26 of the element is adjacent a rotatable member 90 having a second pin bar 94. The tail portion 26 of the element 22 engages the second pin bar 94. The drum 56 and the rotatable member 90 rotate together or substantially rotate together to hold the element 22 into contact with the exterior surface 88 of the drum 56 during thermal development, i.e., as the element is cycled by the heater 80 and the roller 52. The heater 80 may be preheated before the element 22 reaches the heater 80, and then switched to an operating setting to achieve the desired temperature for melting, softening or liquefying the composition layer on the element 22. After the lead portion 24 of the element 22 passes the position where the roller 52 will contact the drum 56, the pneumatic roll loading cylinder/s 83 moves the arms 84 attached to the roller 52 thereby carrying the development medium web 32 and foil 54 against the element 22. The photosensitive printing form composition layer is most preferably heated to between 40 and 230° C. (104 and 392° F.) while in contact with the development medium. (These parameters are illustrative). The development web 32 contacts the exterior surface 28 of the element 22, and absorbs the liquefied portions of the polymer from the unexposed portions of the composition layer, forming a relief pattern or surface suitable for use as a printing form. By maintaining more or less intimate contact of the development medium 32 with the element 22 that is molten in the uncured regions, a transfer of the uncured photosensitive material from the element 22 to the development web 32 takes place. While still in the heated condition, the development web 32 is separated from the cured element 22 to reveal the relief structure.

As the trailing portion of the element 22 passes the roller 52-drum 56 contact point, i.e., nip 86, the heater 80 may cool down or turn off, the pneumatic roll loading cylinder 83 will retract the roller 52, and travel of the web 32 and foil 54 will be stopped. The drum 56 may return the lead portion 24 of the element 22 to the home position to begin another cycle of heating and contacting. A cycle of the steps of heating the element 22 to liquefy the exterior surface 28 and contact the molten portions with the development medium can be repeated as many times as necessary to adequately remove the uncured material and create sufficient relief depth. However, it is desirable to minimize the number of cycles for suitable system performance, and typically the photopolymerizable printing form is thermally treated for 5 to 15 cycles. Intimate contact of the development material to the composition layer (while the uncured portions are melting or liquefying) may be maintained by the pressing the layer and the development material together.

Photosensitive Element

The present invention is not limited to the type of element that is thermally processed. In one embodiment, the photosensitive element includes a flexible substrate and a composition layer mounted on the substrate. The composition layer is at least one layer on the substrate capable of being partially liquefied. In one embodiment, the photosensitive element is an elastomeric printing element suitable for use as a flexographic printing form. In another embodiment, the photosensitive element is a relief printing form suitable for use in letterpress printing. In another embodiment, the photosensitive element is a relief printing form suitable for gravure-like printing. The at least one layer on the substrate is preferably a photosensitive layer, and most preferably a photopolymerizable layer of an elastomeric composition wherein the photosensitive layer can be selectively cured by actinic radiation. As used herein, the term "photopolymerizable" encompasses systems that are photopolymerizable, photocrosslinkable, or both. In cases where the composition layer comprises more than one photosensitive layer on the flexible substrate, the composition of each of the photosensitive layers can be the same or different from any of the other photosensitive layers.

The layer of the photosensitive composition is capable of partially liquefying upon thermal development. That is, during thermal development the uncured composition must soften or melt at a reasonable processing or developing temperature. At least the exterior surface of the composition layer is heated to a temperature sufficient to cause a portion of the layer to liquefy, soften or melt.

The photosensitive layer includes at east one monomer and a photoinitiator, and optionally a binder. The at least one monomer is an addition-polymerizable ethylenically unsaturated compound with at least one terminal ethylenic group. Monomers that can be used in the photosensitive layer are well known in the art and include monofunctional acrylates and methacrylates, multifunctional acrylates and methacrylates, and polyacryloyl oligomers. Further examples of monomers can be found in U.S. Pat. Nos. 4,323,636; 4,753,865; and 4,726,877. A mixture of monomers may be used.

The photoinitiator is a compound that generates free radicals upon exposure to actinic radiation. Any of the known classes of photoinitiators, particularly free radical photoinitiators may be used. Alternatively, the photoinitiator may be a mixture of compounds, one of which provides the free radicals when caused to do so by a sensitizer activated by radiation.

The optional binder is a preformed polymer that serves as a matrix for the monomer and photoinitiator prior to exposure and is a contributor to the physical properties of the photopolymer both before and after exposure. In one embodiment the optional binder is elastomeric. A non-limiting example of an elastomeric binder is an A-B-A type block copolymer, where A represents a nonelastomeric block, preferably a vinyl polymer and most preferably polystyrene, and B represents an elastomeric block, preferably polybutadiene or polyisoprene. Other suitable photosensitive elastomers that may be used include polyurethane elastomers, such as those described in U.S. Pat. Nos. 5,015,556 and 5,175,072. The monomer or mixture of monomers must be compatible with the binder to the extent that a clear, non-cloudy photosensitive layer is produced.

Additional additives to the photosensitive layer include colorants, processing aids, antioxidants, and antiozonants.

The photosensitive element may include one or more additional layers on the side of the photosensitive layer opposite the substrate. Examples of additional layers include, but are not limited to, a release layer, a capping layer, an elastomeric layer, a laser radiation-sensitive layer, an actinic radiation opaque layer, a barrier layer, and combinations thereof. The one or more additional layers preferably are removable, in whole or in part, by contact with the development medium in the range of acceptable developing temperatures for the photosensitive element used. One or more of the additional other layers can cover or only partially cover the photosensitive composition layer. An example of an additional layer which only partially covers the photosensitive composition layer is a masking layer that is formed by imagewise application, e.g., ink jet application, of an actinic radiation blocking material or ink.

The photosensitive element of the present invention may further include a temporary coversheet on top of the uppermost layer of the photosensitive element. One purpose of the coversheet is to protect the uppermost layer of the photosensitive element during storage and handling. Depending upon end use, the coversheet may or may not be removed prior to imaging, but is removed prior to development. Suitable materials for the coversheet are well known in the art.

The substrate is selected to be tear resistant and must have a fairly high melt point, for example, above the liquefying temperature of the composition layer formed on the substrate. The material for the substrate is not limited and can be selected from polymeric films, foams, fabrics, and metals such as aluminum and steel. The substrate can be almost any polymeric material that forms films that are non-reactive and remain stable throughout the processing conditions. Examples of suitable film supports include cellulosic films and thermoplastic materials such as polyolefins, polycarbonates, and polyester. The shape of the support is not limited. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. Multiple layered sleeves are also acceptable and may include an adhesive layer or tape between the layers of flexible material. The sleeve may also be made of non-transparent, actinic radiation blocking materials, such as nickel or glass epoxy. The sleeve typically has a wall thickness from 4 to 80 mils (0.010 to 0.203 cm) or more. Preferred wall thickness for the cylinder form is 10 to 40 mils (0.025 to 0.10 cm). The substrate of the photosensitive element has a thickness of between about 0.01 mm and about 0.38 mm. The radiation curable composition layer is between about 0.35 mm and about 7.6 mm thick, with a preferred thickness of about 0.5 mm to 3.9 mm (20 to 155 mils).

The photosensitive element is prepared for thermal development by imagewise exposing the element to actinic radiation. After imagewise exposure, the photosensitive element contains cured portions in the exposed areas of the radiation curable composition layer and uncured portions in the unexposed areas of the radiation curable composition layer. Imagewise exposure is carried out by exposing the photosensitive element through an image-bearing mask. The image-bearing mask may be a black and white transparency or negative containing the subject matter to be printed, or an in-situ mask formed with the laser radiation sensitive layer on the composition layer, or other means known in the art. Imagewise exposure can be carried out in a vacuum frame, or may be conducted in the presence of atmospheric oxygen, or may be conducted in a controlled environment having an inert gas and a concentration of oxygen less than atmospheric oxygen. On exposure, the transparent areas of the mask allow addition polymerization or crosslinking to take place, while the actinic radiation opaque areas remain uncrosslinked. Exposure is of sufficient duration to crosslink the exposed areas down to the support or to a back exposed layer (floor). Imagewise exposure time is typically much longer than backflash time, and ranges from a few to tens of minutes. For direct-to-plate image formation as disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463 and EP 0 741 330 A1 the image-bearing mask is formed in-situ with the laser radiation sensitive layer using an infrared laser exposure engine.

Actinic radiation sources encompass the ultraviolet, visible and infrared wavelength regions. The suitability of a particular actinic radiation source is governed by the photosensitivity of the initiator and the at least one monomer used in preparing the flexographic printing plates from the photosensitive element. The preferred photosensitivity of most common flexographic printing plates is in the UV and deep visible area of the spectrum, as they afford better room-light stability. The portions of the composition layer that are exposed to radiation chemically cross-link and cure. The portions of the composition layer that are unirradiated (unexposed) are not cured and have a lower melting or liquefying temperature than the cured irradiated portions. The imagewise exposed photosensitive element is then ready for heat development with the absorbent material to form a relief pattern.

An overall back exposure, a so-called backflash exposure, may be conducted before or after the imagewise exposure to polymerize a predetermined thickness of the photopolymer layer adjacent the support. This polymerized portion of the photopolymer layer is designated a floor. The floor thickness varies with the time of exposure, exposure source, etc. This exposure may be done diffuse or directed. All radiation sources suitable for imagewise exposure may be used. The exposure is generally for 10 seconds to 30 minutes.

Following overall exposure to UV radiation through the mask, the photosensitive printing element is thermally developed as described above to remove unpolymerized areas in the photopolymerizable layer and thereby form a relief image. The thermal development step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are also removed or substantially removed from the polymerized areas of the photopolymerizable layer during thermal development. After thermal development, the flexographic printing form may be post exposed and/or chemically or physically after-treated in any sequence to complete the photopolymerization and detackify the surface of the flexographic printing form.

Printing forms (i.e., photopolymerizable element that has been exposed and processed) prepared according to the present method can have a durometer of about 40 to 70 Shore A. Photosensitive elements having photopolymerizable layer as described herein, and the resulting printing forms have an elastomeric layer that is relatively incompressible. Durometer is one of several ways to indicate the hardness of a material, and is defined as the resistance of a material to permanent indentation. Durometer measures the depth of an indentation in a material (typically specified as having a 0.25 inch thickness) by a given force on a standardized presser foot. There are several scales of durometer, of which the Shore A scale is typically used for softer plastics. Each scale results in a value between 0 and 100, with higher values indicating a harder material. Shore A durometer is also typically used to characterize elastomeric printing precursors and printing forms. However, in some instances printing forms are not available at the specified thickness of 0.25 inch (0.64 cm) used for Shore A durometer measurements. So the measurement of the Shore A durometer is often conducted on readily available printing forms having on 67 mil (0.067 inch) (0.17 cm) thickness (that is, the thickness of the photopolymerizable layer and the support). In some embodiments, the printing form (having a total thickness of the photopolymerizable layer and the support of 67 mil) has a durometer of about 50 to 80 Shore A. In some embodiments, the durometer of the printing form having 67 mil thickness is between 50 and 65 Shore A. In other embodiments, the durometer of the printing form 65 and 80 Shore A. The Shore A durometer can be measured, for example, using a Shore Durometer Hardness Gauge Type "A-2" manufactured by The Shore Instrument & Manufacturing Company, Inc. (Jamaica, N.Y., USA). Other instruments for measuring Shore A durometer are readily available and are well known to those of ordinary skill in the art.

EXAMPLES

In the following examples, all percentages are by weight unless otherwise noted. CYREL® photopolymerizable printing plates, CYREL® Digital Imager, CYREL® exposure unit, and CYREL® processor, are all available from The DuPont Company (Wilmington, Del.).

Instrumentation

Common imaging techniques, such as a microscope or optical devices, may have been used to determine the quality and/or degree of various features of the relief surface of the printing plate. One example of a suitable optical device is a Betaflex flexo analyzer unit, from Beta Industries (Carlstadt, N.J.), which captures the raised structure of a relief printing form as an image for measurement and analysis of relief characteristics such as dot area, screen ruling, and dot quality.

A Hirox 3D Digital Microscope was used to measure cleanout, i.e., depth of the recessed areas, and other features as indicated in the raised areas of a plate.

Example 1

The following Example demonstrates that thermal processing of photosensitive elements in a thermal development unit having a hot roller with a compressible collar with a Poisson's ratio of less than 0.4, and a drum having an anodized layer on the aluminum without an elastomeric layer, produces relief printing forms with a relief surface suitable for printing, and without defects such as creases or wrinkles.

The photosensitive elements used were CYREL® flexographic printing precursors which included a support; a layer of a photopolymerizable composition adjacent the support which was composed of an elastomeric binder, an ethylenically unsaturated compound, photoinitiator, and other additives; adjacent the photopolymerizable layer opposite the support was a layer of a composition having an actinic radiation opaque material and a binder, which was capable of being ablated from the precursor by infrared laser radiation; and a coversheet adjacent the ablatable layer. All photosensitive elements had a size of 50 inch by 80 inch. Several different types of photosensitive elements were used, which are identified by a combination of numbers (representing the total thickness of the support and photopolymerizable layer in mils) and letters (representing the product type), and are referenced as Plates 1 through 5 as indicated in the table below. The actinic radiation opaque layer of each photosensitive element was laser ablated with infrared laser radiation on a CYREL® Digital Imager to form in-situ mask, and then exposed on a CYREL® 3000ETL exposure unit to ultraviolet radiation 365 nm through the support to form a floor and through the in-situ mask, at energy density of 12.5 mWatts/cm$^2$ for back exposure and 14.4 mWatts/cm$^2$ for main exposure at the times indicated below prior to thermal development.

|  | Plate 1 45DFM | Plate 2 107DFQ | Plate 3 107DFR | Plate 4 67DFM | Plate 5 67DFR |
|---|---|---|---|---|---|
| Back exposure (sec) | 44 | 105 | 140 | 23 | 75 |
| Main exposure (sec) | 360 | 360 | 360 | 360 | 360 |

The photosensitive elements were processed in a thermal development apparatus substantially as shown in FIG. 1 having a support drum for supporting the elements during thermal development, a heated nip roller, i.e., hot roller, capable of supporting a multilayer web in contact with an exterior surface of the elements, and a nozzle blower assembly oriented with its air exit to impinge the exterior surface of the element prior to nip contact with a development medium by the hot roller. The hot roller included a compressible collar of a closed-cell silicone foam having a Poisson's ratio less than 0.4, a Compression Force Deflection of 60 pounds per square inch at 25% deflection; and a thin thermally-conductive solid silicone elastomeric layer as an outermost layer on the compressible collar. The drum had an exterior surface that included an anodized coating layer, but did not include an elastomeric or solid silicone layer, and so the exterior surface of the drum was considered a smooth metallic surface. A multilayer web was composed of a polyester non-woven as an absorbent material and a polyethylene terephthalate film (0.5 mil) as a support that were individually supplied to the hot roller. Each web of the two materials was brought together into contact at the hot roller such that the support was adjacent the absorbent material and opposite the exterior surface of the photosensitive element, and the nonwoven contacted the exterior surface of the photosensitive element, to provide a development medium at the nip. Thereafter, the multilayer web (or development medium) transported as one web to a take-up or waste roll.

Each of the element(s) was positioned and secured under tension to the support drum, with the exterior surface of the element (i.e., surface opposite the base support) facing the air nozzle and the hot roller carrying the development medium. The elements were thermally treated at the processing conditions for all passes described as follows. The exit of the air nozzle was a linear array of a plurality of holes which was directed at the exterior surface of the element. The hot roller was heated externally to a temperature indicated with heating bulbs of infrared radiation. For the plate elements of Example, a development cycle of the photosensitive element in the thermal processor constituted heating the exterior surface of the element, contacting the element with a web of the development medium to remove unpolymerized portions, and separating the development medium from the element. The plate elements of Example were all preheated by the air emitting from the nozzle exit, contacted with the development medium which was supported by the hot roller, and separated from the development medium which carried away portions of molten photopolymerizable material (i.e., unexposed portions of the photopolymerizable layer). After the last cycle for development to remove material in depth, the surface of the plate was polished by rotating the plate past the air jet without contact, i.e., polish cycle, by the development medium.

|  | Plate 1 | Plate 2 | Plate 3 | Plate 4 | Plate 5 |
|---|---|---|---|---|---|
| Hot roll temperature (° F.) | 390 | 390 | 390 | 390 | 390 |
| Hot roll pressure (pounds per linear inch) | 85 | 100 | 100 | 85 | 100 |
| Air Jet Temp (° F.) | 465 | 465 | 465 | 475 | 575 |
| Drum rotation (inch per minute) | 70 | 60 | 90 | 70 | 80 |
| Development Cycles | 13 | 12 | 11 | 14 | 9 |
| Polish air jet temperature (° F.) | 465 | 465 | 465 | 475 | 575 |
| Polish drum rotation (inch/minute) | 50 | 45 | 45 | 50 | 45 |
| Polish Cycles | 1 | 1 | 1 | 1 | 1 |

After the indicated number of cycles including polishing cycle, the quality of the relief structure of the plate was evaluated and recorded in the following Table.

|  | Plate 1 | Plate 2 | Plate 3 | Plate 4 | Plate 5 |
|---|---|---|---|---|---|
| Durometer (Shore A) | 70 | 70 | 66 | 58 | 71 |
| Waves or creases formed? | No | No | No | No | No |
| Relief uniformity | Good | Good | Good | Good | Good |
| Reverse cleanout | Good | Acceptable | Good | Acceptable | Acceptable |
| Dot quality | Good | Good | Good | Good | Good |

The results clearly showed that thermal development in a processor having the combination of a hot roller having a compressible collar of a closed-cell foam elastomer to supply the development medium and to heat the photosensitive element and a drum having a smooth metallic surface carrying the photosensitive element, produced plates without waves or creases, and with a relief surface suitable for printing. The plates have different hardness as indicated by the durometer and were successfully thermally processed without creasing, waves, or wrinkles.

Comparative 1

The following tests demonstrated that processing in a thermal developer unit having a hot roller with a solid silicone layer and a drum having no elastomeric covering layer formed creases and/or wrinkles in photosensitive elements.

A prototype of a CYREL®FAST TD1000 thermal developer unit the same as or very similar to the apparatus as described in FIG. 6 of U.S. Pat. No. 6,797,454 was used for testing. The thermal developer unit included a drum having an exterior surface that was painted with Dow 236 dispersion to act as a tackification layer, and did not include an elastomeric or solid silicone layer, which would provide compliance on the back side of the printing elements being processed; and, a hot roller having an exterior surface that was formed of a solid silicone rubber having a Shore A hardness of about 50. Infrared lamps were used to aid in heating the photosensitive element, and the value for IR in the Conditions below indicates the percentage of full power. The drum was heated by the process and the chiller was used to maintain the drum at the temperature indicated, with a sensor positioned to determine temperature at an end of the drum close to its exterior surface and close where the printing element is mounted. The Speed is the surface speed of the drum in inch per minute. In Conditions below, the "Press" value is a percentage of 2.25 psi/linear inch of plate width that is applied in each cycle (100 is equivalent to 2.25 psi per linear inch of plate width).

The photosensitive elements used were CYREL® flexographic printing elements, FD1 (67 mils), and having 30 inch by 46 inch size. The printing elements were exposed to UV radiation at 354 nm through the support to form a floor and through a test target for imagewise exposure.

Photosensitive elements were processed in thermal development unit described above, at the conditions indicated below to form a relief surface suitable for flexographic printing. Pressure was 2.25 psi per inch of plate width. This was the pressure that was applied to the air cylinders actuating the pressure roll. A pass of the printing element in the thermal processor constituted heating the element, contacting the element with a web of a nonwoven development medium to remove unpolymerized portions, and separating the development medium from the element.

| Conditions | |
| --- | --- |
| Heated Roll | 325° F. |
| Drum | 88° F. |
| Chiller | 29° C. |
| Pressure | 2.25 psi/in |

| Cycle | Press | Speed | IR |
| --- | --- | --- | --- |
| 1 | 100 | 25 | 80 |
| 2 | 100 | 30 | 80 |
| 3 | 90 | 35 | 70 |
| 4 | 90 | 35 | 70 |
| 5 | 80 | 40 | 70 |
| 6 | 80 | 40 | 60 |
| 7 | 70 | 40 | 60 |
| 8 | 70 | 40 | 60 |
| 9 | 60 | 40 | 60 |
| 10 | 60 | 40 | 50 |
| 11 | 60 | 40 | 50 |

The results of testing four printing elements, Tests 1-4, each at different configurations on the drum follows.

| Test | Thermal Developer Conditions | Results |
| --- | --- | --- |
| 1 | Plate mounted onto drum with rear edge of plate held by elastic bands. | Bad machine direction wrinkles formed after first pass, with severe creases at trailing edge. Plate ejected after 9 passes. |
| 2 | Same as for Test 1, but a Mylar® G40 sheet was placed between the drum surface and the plate | One bad crease formed at trailing edge, no other visible wrinkles. Open areas had 22-25 mils of relief. |
| 3 | Same as for Test 1 except that pressure was reduced by half by entering plate width of 15 inch instead of 30. | Some wrinkles observed on first two passes, but were gone by pass six. Open areas had 22 to 25 mils relief. |
| 4 | Same as for Test 1 but changed rotation speed of drum to 40 inch per minute. | Wrinkles immediately formed, and several creases. Plate stopped after 10 passes. |

The results of Comparative 1 clearly showed that thermal development in a processor having the combination of a hot roller having a solid silicone outer layer to supply the development medium and to heat the photosensitive element and a drum having a hard metal surface carrying the photosensitive element, produced plates with creases and wrinkles. Wrinkles were temporarily formed in the plate even when pressure at the nip was reduced, but was considered an unacceptable mode of operation.

Despite the differences between the thermal development processors of Example 1 and the Comparative 1, comparison of the resulting plates showed that the compliant property of the material on the nip hot roller greatly influenced the quality of the printing elements, particularly the formation of creases and wrinkles. Printing elements in both Example 1 and Comparative 1 resided on a non-compliant surface of the drum, i.e., merely a painted or anodized metal surface, and thus the influence of the compliance of the nip hot roller on the printing element was a direct comparison. For Comparative 1, the hot roller having the layer of a solid silicone (having Durometer 50 Shore A) induced wrinkles and/or creases into printing elements that resided on the tackification surface of the drum. For Example 1, a heated nip roller having a compressible collar of a closed-cell elastomeric foam (having a Poisson's ration less than 0.4, and a compression force deflection of 60 psi at 25% deflection) provided desired relief surface for printing and did not induce wrinkles and/or creases into the printing elements that resided on an anodized metal drum surface.

Example 3

This Example demonstrates thermal development of photosensitive elements with the use core member having a compressible collar of closed-cell foam with a Poisson's ratio of less than 0.4 and with different compression force deflection at 25% deflection.

The photosensitive elements used were CYREL® flexographic printing precursor, type DFH (45 mils, which was the total thickness of the base support and photopolymerizable layer), which included a support; a layer of a photopolymerizable composition adjacent the support which was composed of an elastomeric binder, an ethylenically unsaturated compound, photoinitiator, and other additives; adjacent the photopolymerizable layer opposite the support was a layer of a composition having an actinic radiation opaque material and a binder, which was capable of being ablated from the precursor by infrared laser radiation; and a coversheet adjacent the ablatable layer. The precursors were exposed to laser radiation to form an in situ mask, exposed to UV radiation through the support and through the in-situ mask prior to thermal development. The photosensitive elements were cut to size for thermal development processing.

The photosensitive elements were processed in a thermal development test bed apparatus substantially as shown in FIG. 1 having a support drum for supporting the elements during thermal development, a heated nip roller capable of supporting a multilayer web in contact with an exterior surface of the elements, and a nozzle blower assembly oriented with its air exit to impinge the exterior surface of the element. The test bed apparatus tested photosensitive elements that were about 6 inch wide. For each test, the test bed apparatus was modified to include a different heated nip roller having a compressible collar of a closed-cell foam as indicated below. Each hot roll also included a thermally-conductive solid silicone layer, type Thermo Cool TC100 (from Saint-Gobain, Aurora, Ohio, USA).

The multilayer web was composed of a polyester nonwoven as an absorbent material and a polyethylene terephthalate film (0.5 mil) as a support that were individually supplied to the hot roller. Each web of the two materials was brought together into contact at the hot roller such that the support was adjacent the absorbent material and opposite the exterior surface of the photosensitive element, and the nonwoven contacted the exterior surface of the photosensitive element, to provide a development medium at the nip. Thereafter, the multilayer web (or development medium) transported as one web to a take-up or waste roll.

Each of the elements was positioned and secured to the support drum, with the exterior surface of the element (i.e., surface opposite the base support) facing the air nozzle and the hot roller carrying the development medium. The elements were thermally treated at the processing conditions for all passes described as follows in Table 1. The drum carrying the element was rotated at 60 inch per minute. The hot roller was heated externally to a temperature as indicated in Table 1 with heating bulbs of infrared radiation. A cycle of the photosensitive element in the thermal processor constituted heating the exterior surface of the element, contacting the element with a web of the development medium to remove unpolymerized portions, and separating the development medium from the element. The photosensitive elements of Example were all preheated by the air emitting from the nozzle exit, contacted with the development medium which was supported by the hot roller, and separated from the development medium which carried away portions of molten photopolymerizable material (i.e., unexposed portions of the photopolymerizable layer).

TABLE 1

|  | Test 1 | Test 2 | Test 3 | Test 4 |
| --- | --- | --- | --- | --- |
| Nip Roll Load (pounds force) | 325[a] | 500 | 500 | 500 |
| Nip Roll Temp ° F. | 390 | 390 | 390 | 390 |
| Drum Temp ° F. | 70 | 70 | 70 | 70 |
| Slot Jet Air Temp ° F. | 400 | 425 | 425 | 425 |
| Slot Jet Volume SCFM | 6.4 | 10 | 10 | 10 |
| Distance of Slot Jet exit to surface of element (mm) | 4 | 6 | 6 | 6 |
| Cycles | 10 | 10 | 10 | 10 |

[a] The load on the nip roll was lower than for other tests since the closed-cell foam for Test 1 over compressed at 500 pounds-force.

After the indicated number of cycles, the relief depth was measured with Hirox 3D digital microscope in several locations on the plate and the relief depth for each plate was recorded indicating cleanout quality in Table 2.

TABLE 2

| Test Cond. | Nip Roll Compression Layer | Nip Roll Compression Force Deflection (psi at 25% deflection) | Clean Out Quality |
| --- | --- | --- | --- |
| 1 | HT840 | 22 | Relief was down to floor, but image cleanout was bad (a ledge of uncured material was present at or near the printing surface). |
| 2 | SE524 | <20 psi | 45-55 micron |
| 3 | R40 | 40 psi | 60-75 micron |
| 4 | R60B | 60 psi | 72-80 micron |

HT840 was BISCO ® cellular silicone foam from Rogers Corp. (Rogers Connecticut, USA), having the indicated compression force deflection and a density of 27 pcf.
SE524 was cellular silicone elastomer foam from Silicone Engineering (Lancashire, England), having the indicated compression force deflection and a density of 25 pcf.
R40 was high-temperature closed-cell silicone foam that was made upon request to have the indicated compression force deflection.
R60B was high-temperature closed-cell silicone foam that was made upon request to have the indicated compression force deflection, and a density of about 67 pcf.

The results showed that clean-out of the relief surface increased, i.e., improved, as compression force deflection at 25% deflection of the compressible collar of closed-cell elastomeric foam increased. An nip rolls had the same layer of thermally-conductive solid silicone on the compressible collar. The nip roll having the compressible collar layer having a compression force deflection of 60 psi at 25% deflection performed the best, as determined by the highest cleanout, i.e., greatest removal of uncured material, for the particular photosensitive element tested.

Example 4

Example 3 was repeated except that the test bed apparatus was modified to include a heated nip roll having a compressible collar of a closed-cell foam as indicated below. The hot roll included a thermally-conductive solid silicone layer, type ThermoCool TC100. The photosensitive element tested was 45DFH. The Conditions for the test were the same as was used for Test 4 in Example 3.

| Test Cond. | Nip Roll Compression Layer | Nip Roll Compression Force Deflection (psi at 25% deflection) | Clean Out Quality |
|---|---|---|---|
| 4 | BB5015 | 70 | 95 micron |

BB5015 was high-temperature closed-cell silicone foam that was made upon request to have the indicated compression force deflection.

Clean-out quality of the resulting plate sample was very good. However, some slight bending or distortion of fine raised elements, such as highlight dots and lines, was observed. The results indicate that the heated nip roll having a compressible collar of a dosed-cell foam with a compression force deflection of 70 psi at 25% deflection could be suitable for most photosensitive elements, but is believed to be nearing upper end of limit.

What is claimed is:

1. An apparatus for preparing a relief printing form from a photosensitive element having an exterior surface and comprising a layer of a photopolymerizable composition capable of being partially liquefied, comprising:
    a) means for supporting a development medium with a core member adjacent to the exterior surface;
    b) means for heating the exterior surface to a temperature sufficient to cause a portion of the layer to liquefy and form liquefied material; and
    c) means for contacting the photosensitive element with the development medium to allow the liquefied material to be removed by the development medium;
    wherein the means for supporting the development medium comprises a compressible collar disposed between the core member and the development medium, the compressible collar comprising a closed-cell foam having a Poisson's ratio of less than 0.4, and
    wherein the means for supporting further comprises a layer of thermally-conductive solid elastomer forming an outermost layer on the compressible collar disposed between the compressible collar and the development medium, wherein the thermally-conductive solid elastomer layer contains one or more fillers to provide thermal-conductivity to the layer, and further
    wherein the means for heating comprises means for heating with radiant energy the outermost surface of thermally conductive solid elastomer layer, wherein the radiant energy heating means is directed at the exterior surface of the thermally conductive layer opposite the compressible collar.

2. The apparatus of claim 1 wherein the closed-cell foam is selected from silicone, fluorosilicone rubbers, fluorocarbon rubbers, or ethylene propylene diene rubbers (EPDM).

3. The apparatus of claim 1 wherein the compressible collar has Poisson's ratio between 0.10 and 0.40.

4. The apparatus of claim 1 wherein the compressible collar has a compression force deflection of 25 to 85 pounds per square inch (psi) at 25% deflection.

5. The apparatus of claim 1 wherein the compressible collar has a thickness of 0.05 to 0.80 inch.

6. The apparatus of claim 1 wherein the solid elastomer is selected from silicone, fluorosilicone rubbers, fluorocarbon rubbers, or ethylene propylene diene rubbers (EPDM).

7. The apparatus of claim 1 wherein the thermally-conductive solid elastomer layer has a thermal conductivity of 1.0 to 2.0 Watt per meter-Kelvin.

8. The apparatus of claim 1 wherein the core member is a roller, the compressible collar is secured to the roller and comprises a closed-cell silicone foam with Poisson's ratio of 0.10 to 0.40 and a compression force deflection of 35 to 70 at 25% deflection, and further comprising a thermally-conductive solid silicone layer having a thermal conductivity of 1.0 to 2.0 Watts per meter-Kelvin and secured to a side of the compressible collar adjacent the development medium and opposite the core member.

9. The apparatus of claim 1 further comprising means for supporting the photosensitive element on a support member having an inflexible exterior surface.

10. The apparatus of claim 1 wherein the one or more fillers in the thermally-conductive solid elastomer layer are selected from the group consisting of alumina, titanium dioxide, zinc oxide, iron oxide, and carbon black.

11. The apparatus of claim 1 wherein the thermally-conductive solid elastomer layer has a durometer hardness of from about 40 to about 90 Shore A.

* * * * *